(12) United States Patent
Caveney

(10) Patent No.: US 7,281,957 B2
(45) Date of Patent: Oct. 16, 2007

(54) COMMUNICATIONS CONNECTOR WITH FLEXIBLE PRINTED CIRCUIT BOARD

(75) Inventor: Jack E. Caveney, Hinsdale, IL (US)

(73) Assignee: Panduit Corp., Tinley Park, IL (US)

( * ) Notice: Subject to any disclaimer, the term of this patent is extended or adjusted under 35 U.S.C. 154(b) by 0 days.

(21) Appl. No.: 11/180,216

(22) Filed: Jul. 13, 2005

(65) Prior Publication Data

US 2006/0014410 A1    Jan. 19, 2006

Related U.S. Application Data

(60) Provisional application No. 60/637,024, filed on Dec. 17, 2004, provisional application No. 60/587,416, filed on Jul. 13, 2004.

(51) Int. Cl.
*H01R 24/00* (2006.01)

(52) U.S. Cl. ..................................... 439/676

(58) Field of Classification Search ............... 439/676, 439/607, 941
See application file for complete search history.

(56) References Cited

U.S. PATENT DOCUMENTS

| | | | |
|---|---|---|---|
| 5,163,836 A | 11/1992 | Young et al. | |
| 5,186,647 A | 2/1993 | Denkmann et al. | |
| 5,228,872 A * | 7/1993 | Liu ............................. | 439/607 |
| 5,299,956 A * | 4/1994 | Brownell et al. ........... | 439/638 |
| 5,503,572 A * | 4/1996 | White et al. ................ | 439/676 |
| 5,586,914 A * | 12/1996 | Foster et al. ................ | 439/676 |
| 5,716,237 A | 2/1998 | Conorich et al. | |
| 5,766,034 A | 6/1998 | Block et al. | |
| 5,779,503 A | 7/1998 | Tremblay et al. | |
| 5,791,943 A * | 8/1998 | Lo et al. ..................... | 439/676 |
| 5,797,764 A | 8/1998 | Coulombe et al. | |
| 5,885,111 A | 3/1999 | Yu | |

(Continued)

FOREIGN PATENT DOCUMENTS

EP    0 598 192 A1    5/1994

(Continued)

OTHER PUBLICATIONS

U.S. Appl. No. 11/014,097, filed Dec. 15, 2004, Caveney et al.

(Continued)

*Primary Examiner*—Tulsidas C. Patel
*Assistant Examiner*—Vladimir Imas
(74) *Attorney, Agent, or Firm*—Robert A. McCann; Anthony P. Curtis

(57) ABSTRACT

A communications connector with a flexible printed circuit board is provided. The flexible printed circuit board is electronically and mechanically connected to the plug interface contacts of the jack near the plug/jack interface, in order to provide effective crosstalk compensation. The flexible printed circuit board has fingers at one end allowing it to flex as individual plug interface contacts are depressed when a plug is installed into the jack. A second end of the flexible printed circuit board has through holes for accepting insulation displacement contacts. The second end of the flexible printed circuit board may be rigidly supported, to allow insertion of the insulation displacement contacts. Various designs for capacitive and/or inductive couplings are provided, resulting in improved crosstalk performance.

24 Claims, 31 Drawing Sheets

U.S. PATENT DOCUMENTS

| | | | |
|---|---|---|---|
| 5,915,989 | A | 6/1999 | Adriaenssens et al. |
| 5,997,358 | A | 12/1999 | Adriaenssens et al. |
| 6,017,229 | A * | 1/2000 | Tulley et al. ............... 439/144 |
| 6,017,247 | A | 1/2000 | Gwiazdowski |
| 6,057,743 | A | 5/2000 | Aekins |
| 6,079,996 | A | 6/2000 | Arnett |
| 6,120,330 | A | 9/2000 | Gwiazdowski |
| 6,155,881 | A | 12/2000 | Arnett et al. |
| 6,168,474 | B1 | 1/2001 | German et al. |
| 6,176,742 | B1 | 1/2001 | Arnett et al. |
| 6,196,880 | B1 | 3/2001 | Goodrich et al. |
| 6,231,397 | B1 | 5/2001 | de la Borbolla et al. |
| 6,238,235 | B1 | 5/2001 | Shavit et al. |
| 6,255,593 | B1 | 7/2001 | Reede |
| 6,267,617 | B1 | 7/2001 | Nozick |
| 6,305,950 | B1 | 10/2001 | Doorhy |
| 6,319,069 | B1 | 11/2001 | Gwiazdowski |
| 6,332,810 | B1 | 12/2001 | Bareel |
| 6,338,655 | B1 | 1/2002 | Masse et al. |
| 6,356,162 | B1 | 3/2002 | DeFlandre et al. |
| 6,371,793 | B1 * | 4/2002 | Doorhy et al. ............... 439/404 |
| 6,379,157 | B1 | 4/2002 | Curry et al. |
| 6,379,175 | B1 | 4/2002 | Reede |
| 6,402,560 | B1 | 6/2002 | Lin |
| 6,409,547 | B1 | 6/2002 | Reede |
| 6,410,845 | B2 | 6/2002 | Reede |
| 6,464,529 | B1 | 10/2002 | Jensen et al. |
| 6,464,541 | B1 | 10/2002 | Hashim et al. |
| 6,524,139 | B1 | 2/2003 | Chang |
| 6,533,618 | B1 | 3/2003 | Aekins |
| 6,554,638 | B1 | 4/2003 | Hess et al. |
| 6,736,681 | B2 | 5/2004 | Arnett |
| 6,769,937 | B1 | 8/2004 | Roberts |
| 6,780,035 | B2 | 8/2004 | Bohbot |
| 6,802,743 | B2 * | 10/2004 | Aekins et al. ............... 439/676 |
| 2001/0014563 | A1 | 8/2001 | Morita et al. |
| 2002/0019172 | A1 | 2/2002 | Forbes et al. |
| 2002/0197043 | A1 * | 12/2002 | Hwang ....................... 385/134 |
| 2003/0171024 | A1 | 9/2003 | Mossner et al. |
| 2003/0194908 | A1 | 10/2003 | Brown et al. |
| 2004/0184247 | A1 | 9/2004 | Adriaenssens et al. |
| 2004/0248468 | A1 | 12/2004 | Gurovich et al. |
| 2005/0014420 | A1 | 1/2005 | Quenneville et al. |
| 2005/0207561 | A1 | 9/2005 | Hammond, Jr. |
| 2005/0208838 | A1 | 9/2005 | Horowitz et al. |
| 2006/0014410 | A1 | 1/2006 | Caveney |

FOREIGN PATENT DOCUMENTS

| | | |
|---|---|---|
| EP | 0 901 201 A1 | 3/1999 |
| EP | 1 063 734 A2 | 12/2000 |
| EP | 1 191 646 A2 | 3/2002 |
| EP | 1 275 177 B1 | 1/2003 |
| FR | 2 823 606 A1 | 10/2002 |
| GB | 2 380 334 A | 4/2003 |
| JP | WO 2004/001900 | 12/2003 |
| WO | WO99/30388 | 6/1999 |
| WO | WO99/45611 | 9/1999 |
| WO | WO 01/80376 A1 | 10/2001 |
| WO | WO 2004/086828 A1 | 10/2004 |
| WO | WO 2005/101579 A1 | 10/2005 |

OTHER PUBLICATIONS

U.S. Appl. No. 11/055,344, filed Feb. 10, 2005, Caveney et al.
U.S. Appl. No. 11/078,816, filed Mar. 11, 2005, Caveney et al.
U.S. Appl. No. 11/099,110, filed Apr. 5, 2005, Caveney et al.

* cited by examiner

SECTION A-A

SECTION B-B

SECTION C-C

SECTION D-D

SECTION A-A

SECTION B-B

SECTION C-C

COMMUNICATIONS CONNECTOR WITH FLEXIBLE PRINTED CIRCUIT BOARD

CROSS-REFERENCE TO RELATED APPLICATIONS

This application claims the benefit of U.S. Provisional Application No. 60/587,416, filed Jul. 13, 2004, and U.S. Provisional Application No. 60/637,024, filed Dec. 17, 2004. The entireties of each of these applications are hereby incorporated by reference herein.

FIELD OF THE INVENTION

The present invention relates generally to electrical connectors, and more particularly, to a modular communication jack having a flexible printed circuit board.

BACKGROUND OF THE INVENTION

In the communications industry, as data transmission rates have steadily increased, crosstalk due to capacitive and inductive couplings among the closely spaced parallel conductors within the jack and/or plug has become increasingly problematic. Modular connectors with improved crosstalk performance have been designed to meet the increasingly demanding standards. Many of these improved connectors have included concepts disclosed in U.S. Pat. No. 5,997,358, the entirety of which is incorporated by reference herein. In particular, recent connectors have introduced predetermined amounts of crosstalk compensation to cancel offending near end crosstalk (NEXT). Two or more stages of compensation are used to account for phase shifts from propagation delay resulting from the distance between the compensation zone and the plug/jack interface. As a result, the magnitude and phase of the offending crosstalk is offset by the compensation, which, in aggregate, has an equal magnitude, but opposite phase.

Recent transmission rates, including those in excess of 500 MHz, have exceeded the capabilities of the techniques disclosed in the '358 patent. Thus, improved compensation techniques are needed.

BRIEF DESCRIPTION OF FIGURES ILLUSTRATING PREFERRED EMBODIMENTS

DETAILED DESCRIPTION OF THE PREFERRED EMBODIMENTS

Figure 1:
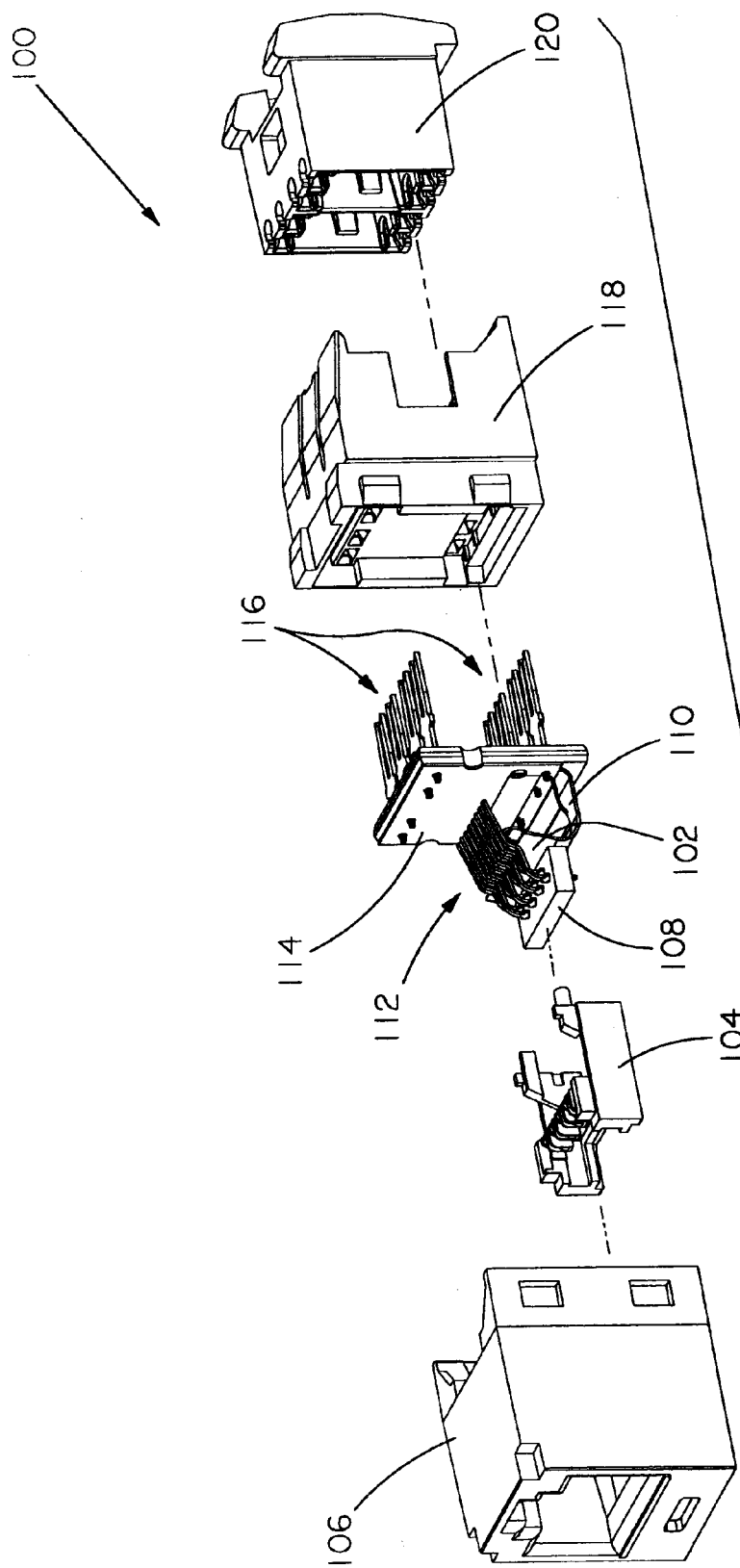
FIG. 1 is a front exploded perspective view of a communications jack
Figure 2:
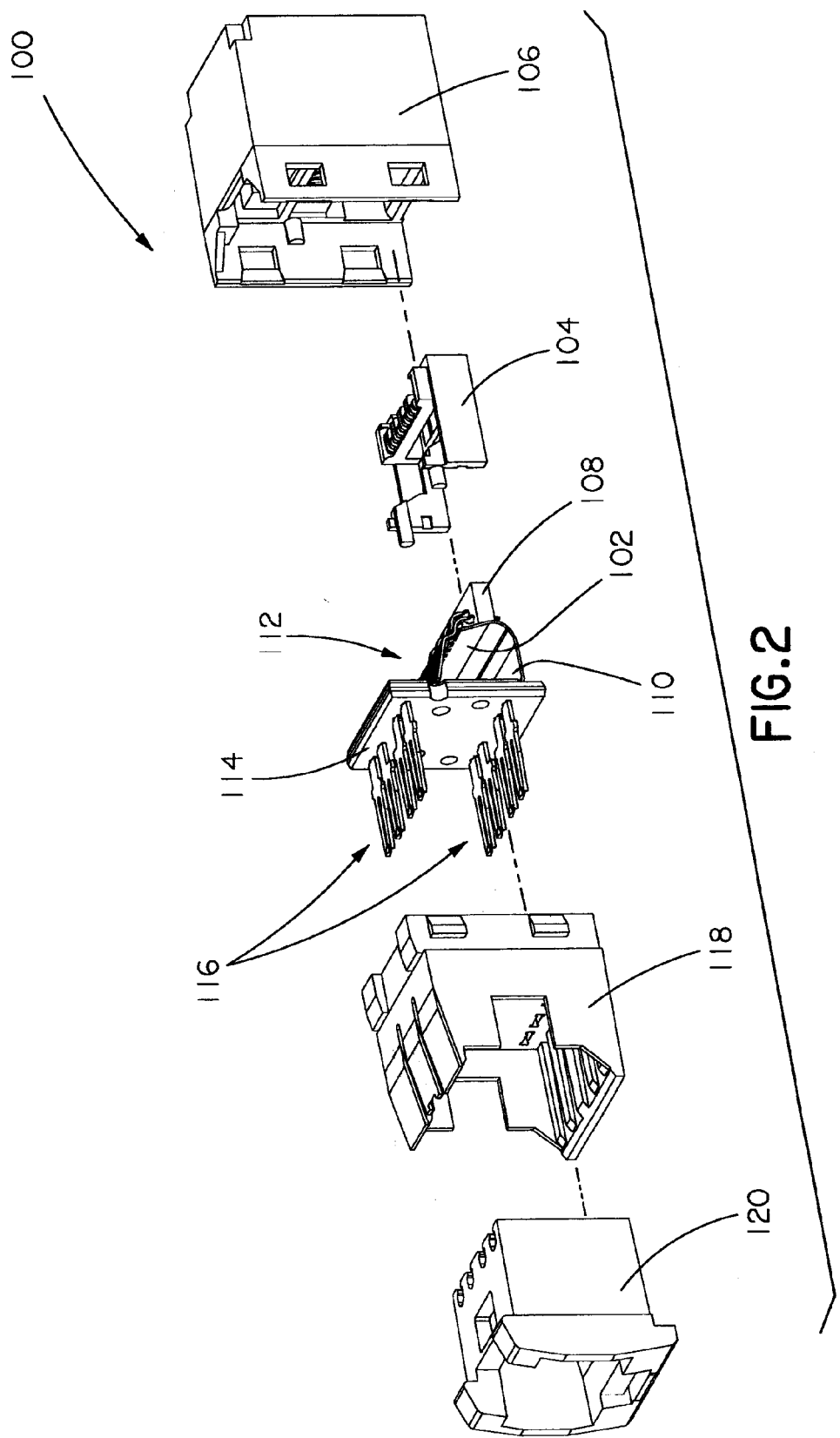
FIG. 2 is a rear exploded perspective view of a communications jack.
Figure 3A:
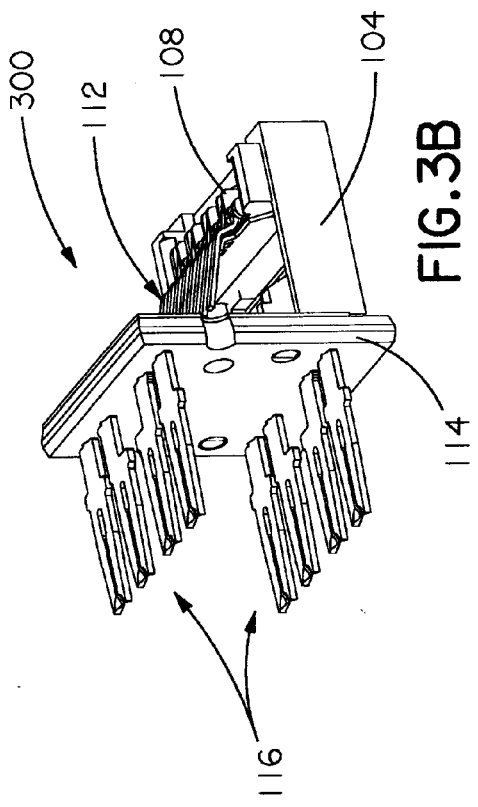
FIGS. 3A-3D are different perspective views of an assembly composing an internal portion of the communications jack of FIGS. 1 and 2.
Figure 3B:
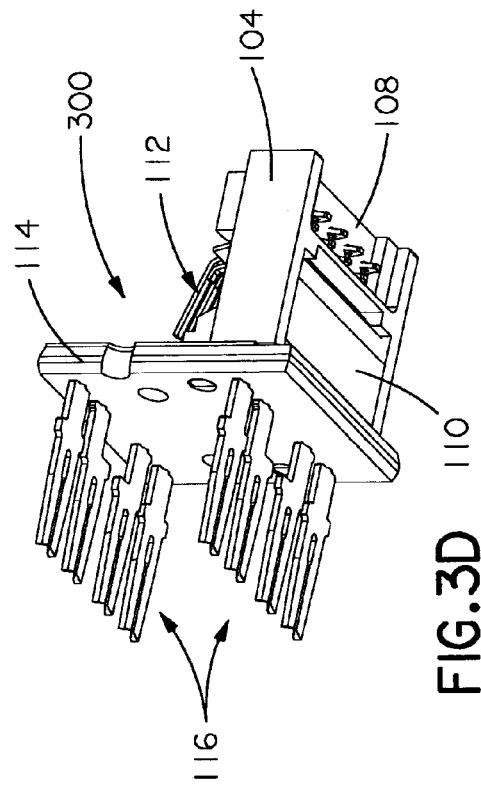
Figure 3C:
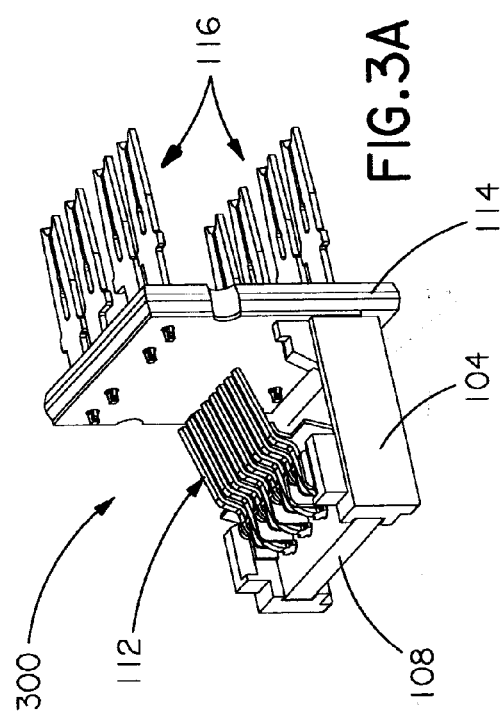
Figure 3D:
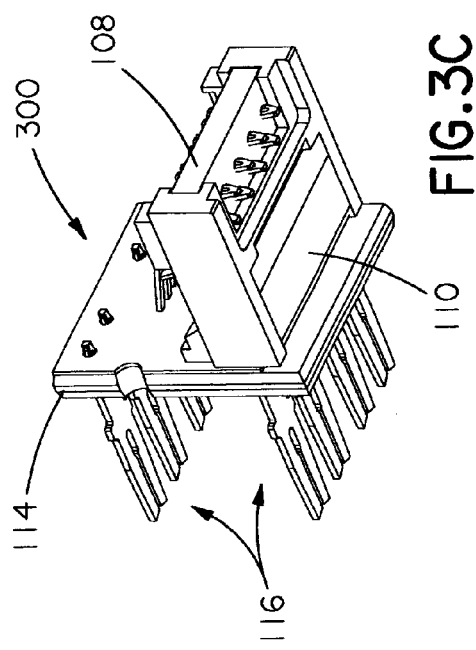

FIGS. 1 and 2 are exploded perspective views of a communications jack 100 having a Flexible Printed Circuit (FPC) 102 in accordance with an embodiment of the present invention. The jack 100 includes a main housing 106 and a bottom front sled 104 and top front sled 108 arranged to support eight plug interface contacts 112. The FPC 102 attaches to the plug interface contacts 112 adjacent to where the plug interface contacts 112 interface with contacts from a plug (not shown). The FPC 102 is attached by conductors 110 (preferably flexible) to a PCB (Printed Circuit Board) 114. The FPC 102, conductors 110, and PCB 114 may all be part of the FPC 102, with the PCB 114 portion of the FPC being a rigid extension of the FPC 102. As illustrated, eight IDCs (Insulation Displacement Contacts) 116 engage the PCB 114 from the rear via through-holes in the PCB 114. A rear housing 118, having passageways for the IDCs 116, and a wire cap 120 serve to provide an interface to a twisted pair communication cable or punch-down block.

In this and other embodiments described herein, the FPC 102 is or includes a substrate with a conductive layer laminated to each side. Unwanted conductive material is etched away from each side during manufacture. To reduce the variation in coupling changes due to registration variation between the conductors on each of the two sides of the FPC 102, a minimum registration tolerance is maintained between the patterns on each side of the FPC 102. In addition, variations in couplings due to trace width tolerances are also minimized in the disclosed design. Because the length of the Near-End Crosstalk (NEXT) compensation zone is approximately equal to the length of the NEXT crosstalk zone, variations in FPC 102 trace width, which tend to be consistent on an individual FPC 102, change the capacitive coupling of the NEXT compensation zone and the NEXT crosstalk zone by approximately the same magnitude. This minimizes the compensation variation due to trace width variation.

FIGS. 3A-3D are perspective views of an assembly 300 comprising an internal portion of the communications jack 100 of FIGS. 1 and 2. This assembly includes the bottom front sled 104, top front sled 108, plug interface contacts 112, FPC 102, conductors 110, PCB 114, and IDCs 116. In one embodiment, the FPC 102 extends back into the jack 100 and includes an integrally formed vertically oriented rigid extension of the FPC 100, through which IDCs 116 make contact with the FPC 102. The rigid extension serves as a support and mounting mechanism, and contains no electrical components itself. Alternative embodiments, however, might utilize portions of the rigid extension for remote capacitive compensation, and are intended to be within the scope of the present invention. Similarly, a rigid compensation PCB may serve to sandwich the FPC 102 between the rigid compensation PCB and the rigid extension. In FIG. 3, the rigid extension is shown as part of the PCB 114.

While the jack 100 and jack components of FIGS. 1-3D are of the type that is terminated to a four-pair communications cable, the same concepts would apply to a punch-down version, with appropriate modifications being made to the rear housing 118, wire cap 120, and possibly the IDCs 116, of the jack 100.

Figure 4:
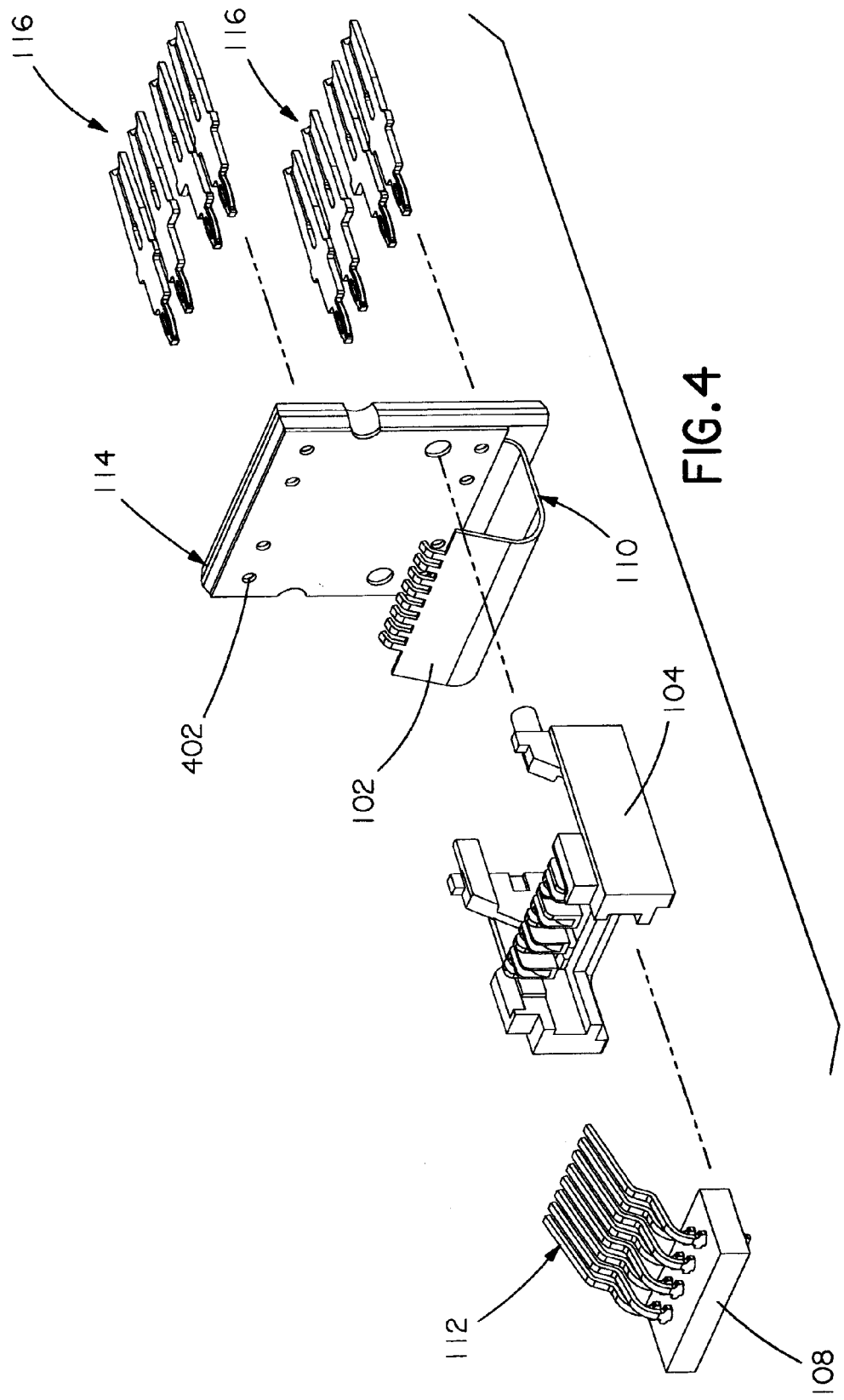
FIG. 4 is a perspective view of an assembly composing an internal portion of the communications jack of FIG. 1.

FIG. 4 is an exploded view of the assembly 300 showing the FPC 102 detached from the plug interface contacts 112 of FIGS. 1-3D. One portion of the FPC 102 might normally be disposed in the bottom front sled 104, with an opposite portion of the FPC 102 situated in a rigid extension of the FPC 102. The rigid extension contains eight through-holes (e.g. through-hole 402) to allow eight IDCs 116 to make mechanical and electrical contact with the FPC 102.

Figure 5:
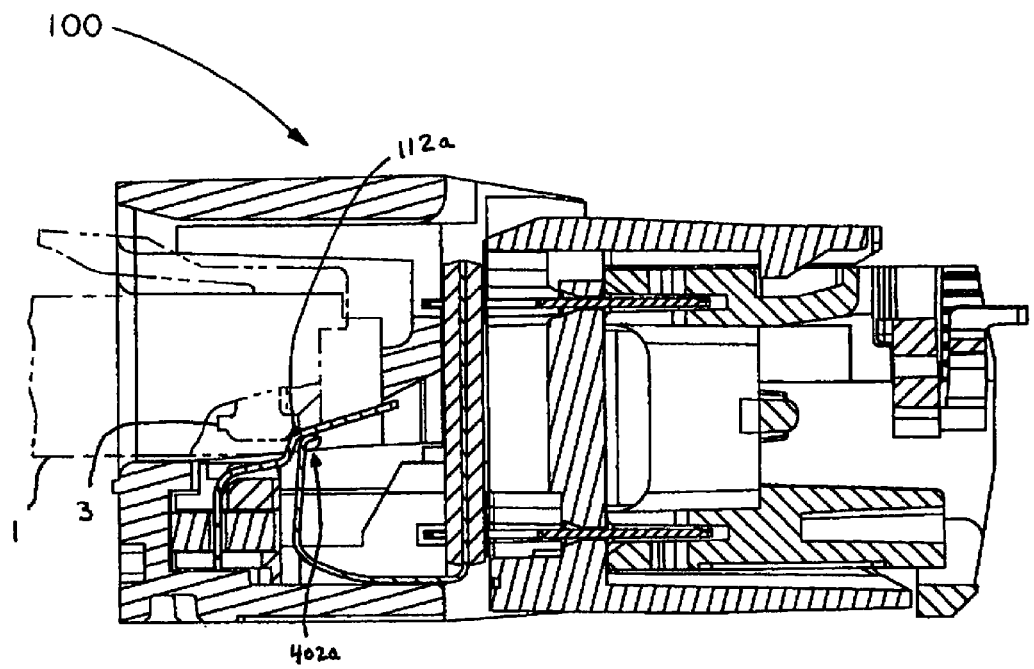
FIG. 5 is a side cross-sectional view of the communications jack of FIG. 1.
Figure 6:
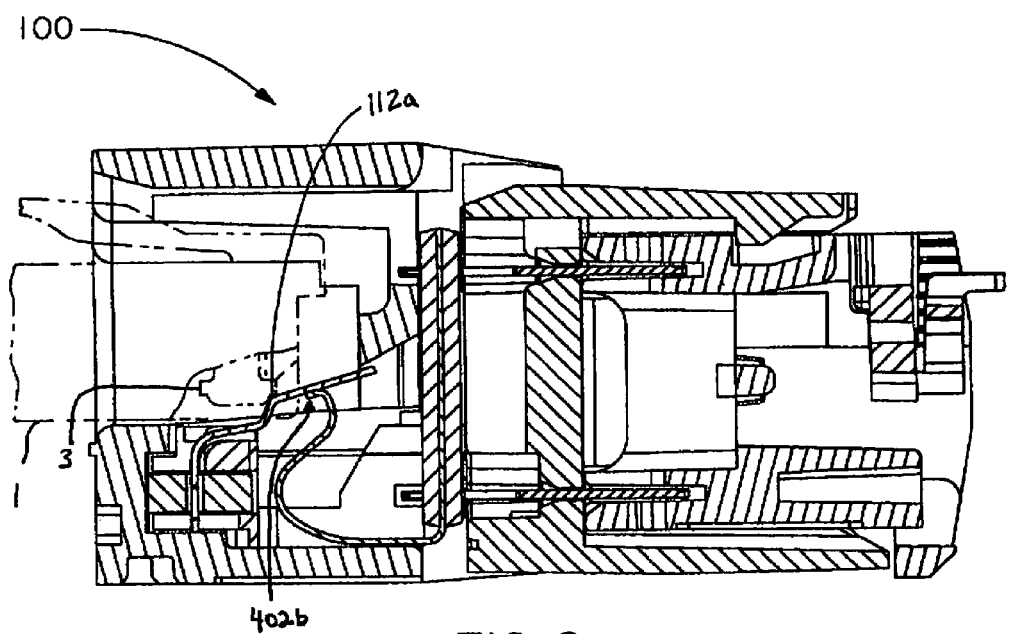
FIG. 6 is a side cross-sectional view of an embodiment of the communications jack of FIG. 1.

FIG. 5 is a side cross-sectional view of the communications jack 100 and FIG. 6 is a side cross-sectional view of the communications jack 100, with a slightly different interface between the plug interface contacts 112 and FPC 102. The two different contact/FPC interfaces 402a and 402b shown both have the FPC 102 electrically and mechanically attached to the plug interface contacts 112. Interface 402a utilizes a rearward attachment, while Interface 402b utilizes a forward attachment. An advantage of the designs shown in FIGS. 5 and 6 is that the plug interface contacts 112 are short and substantially no signal current flows in the plug interface contacts 112, since the contact/FPC interface is located adjacent the plug/jack interface 112a, where the plug interface contacts 112 interface with the plug contacts 3 of the plug 1. This removes a possible source of crosstalk and other noise. The flexibility of the FPC 102 allows it to be connected to all the plug interface contacts 112, which do not move exactly in unison when a plug is installed.

FIGS. 7A-7E illustrate a design of an FPC 102 for leads 3, 4, 5, and 6 for a PCB in a communications jack 100. Solid lines indicate a trace located on the top surface of the FPC substrate, while dashed lines indicate placement on the underside of the FPC substrate. Only leads 3, 4, 5, and 6 are shown because these leads are most susceptible to crosstalk and other noise; thus, compensation is typically targeted toward optimizing at these leads.

In the top elevational views of FIGS. 7A-7E, the FPC 102 is in a flat (unbent) configuration. In the jacks shown in FIGS. 1-6, however, the FPC is shown bending vertically down from the contacts to a horizontal position at the sled, and then vertically up along the rigid extension and/or PCB 114. FIGS. 10-14C illustrate an alternative embodiment, in which the FPC 102 extends back horizontally from the sled, rather than vertically, with vertically oriented IDCs 116 making electrical contact with the horizontally disposed FPC 102.

Figure 7A:
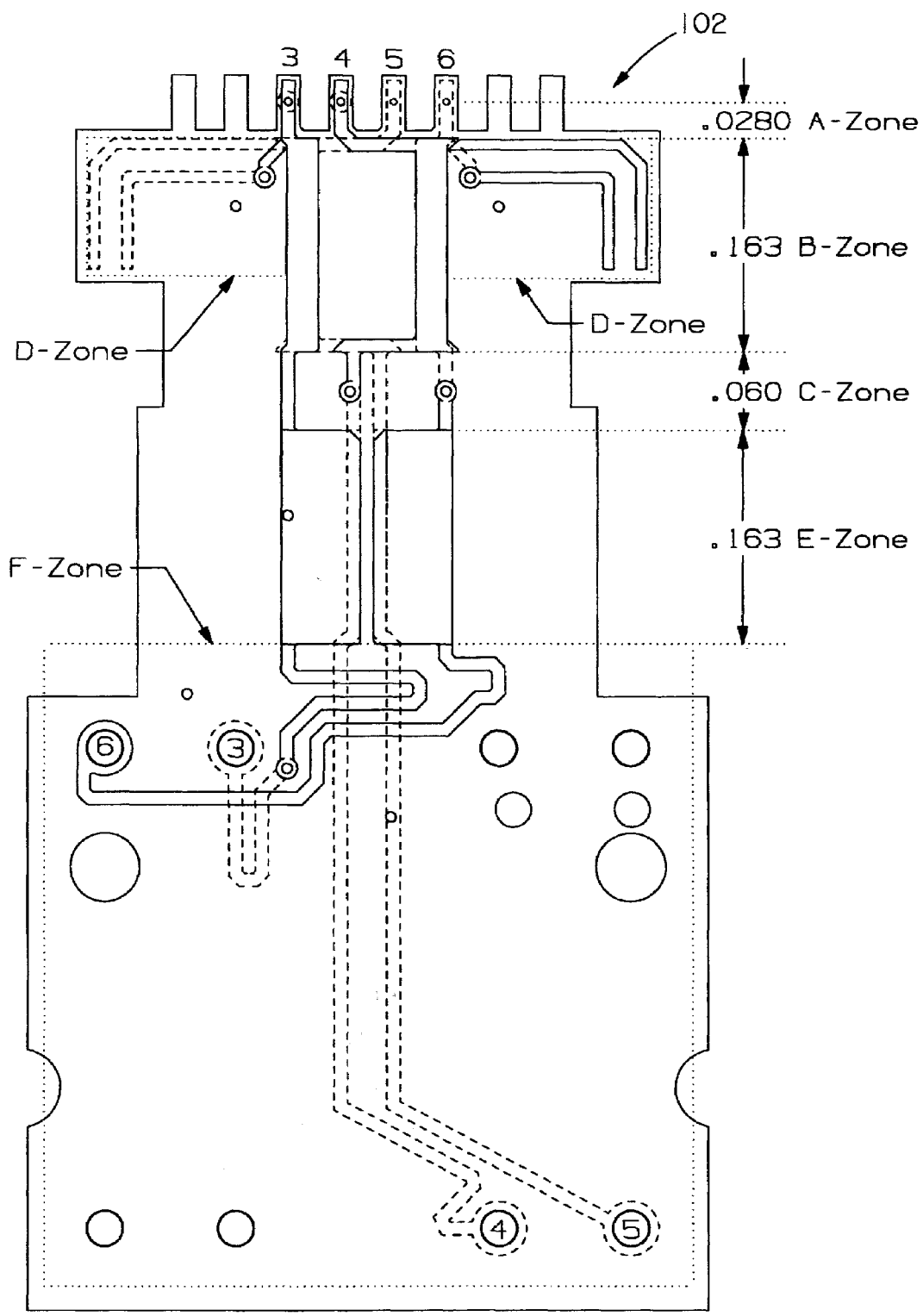
FIG. 7A illustrates a design of a Flexible Printed Circuit for leads 3, 4, 5, and 6 for a Printed Circuit Board in a communications jack.
Figure 7B:
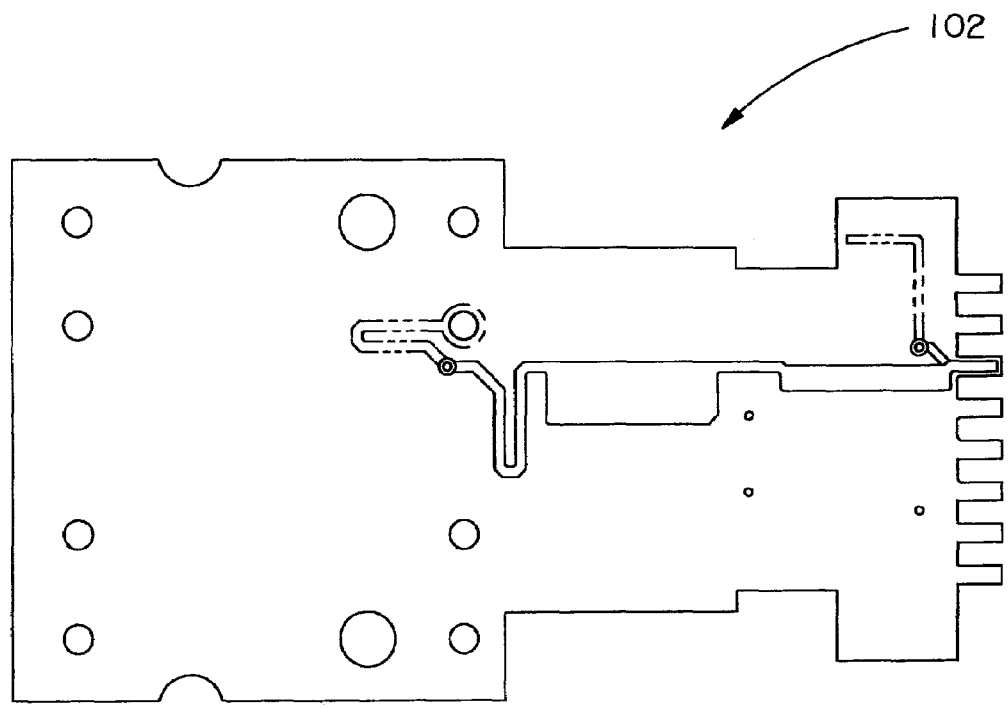
FIG. 7B illustrates a design of a Flexible Printed Circuit for lead 3 for a Printed Circuit Board in a communications jack.
Figure 7C:
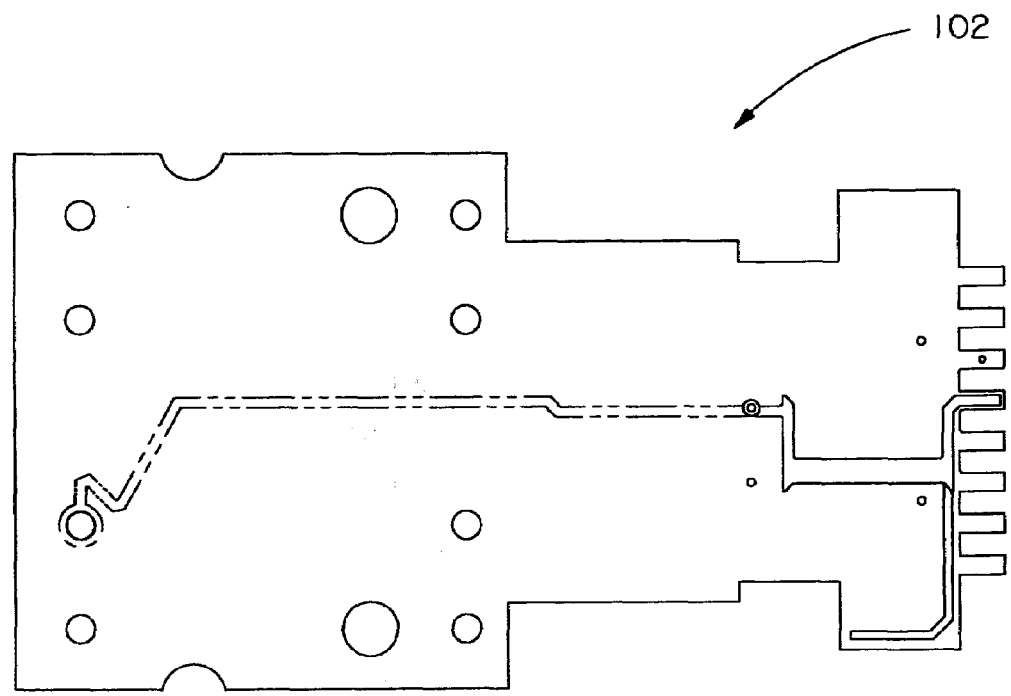
FIG. 7C illustrates a design of a Flexible Printed Circuit for lead 4 for a Printed Circuit Board in a communications jack.
Figure 7D:
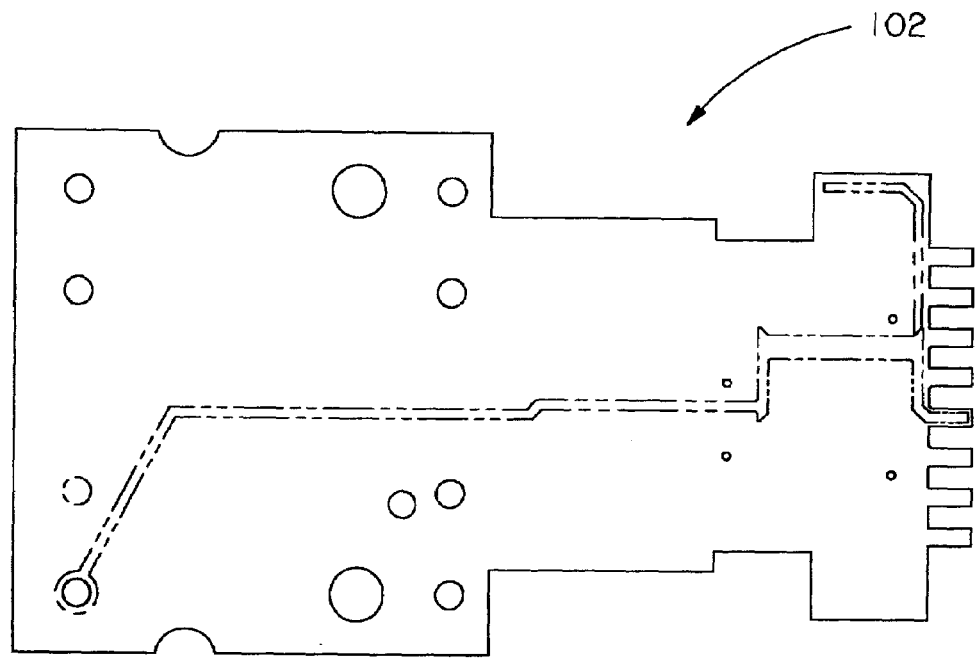
FIG. 7D illustrates a design of a Flexible Printed Circuit for lead 5 for a Printed Circuit Board in a communications jack.
Figure 7E:
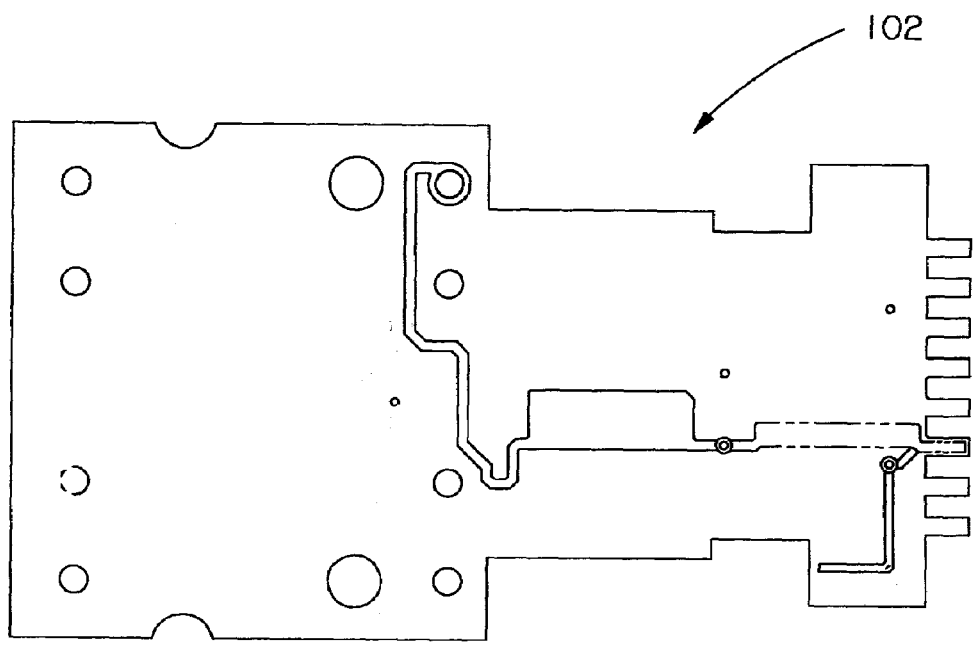
FIG. 7E illustrates a design of a Flexible Printed Circuit for lead 6 for a Printed Circuit Board in a communications jack.
Figure 7F:
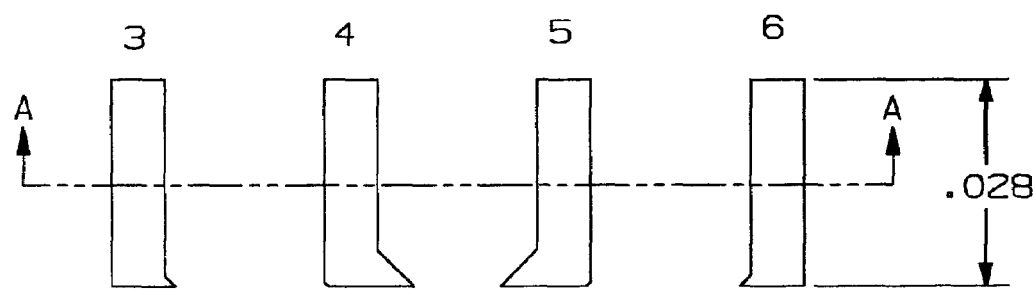
FIGS. 7F-7K illustrate details and cross-sections of the leads 3, 4, 5, and 6 at respective locations of the Flexible Printed Circuit shown in FIG. 7A.
Figure 7F:
Figure 7G:
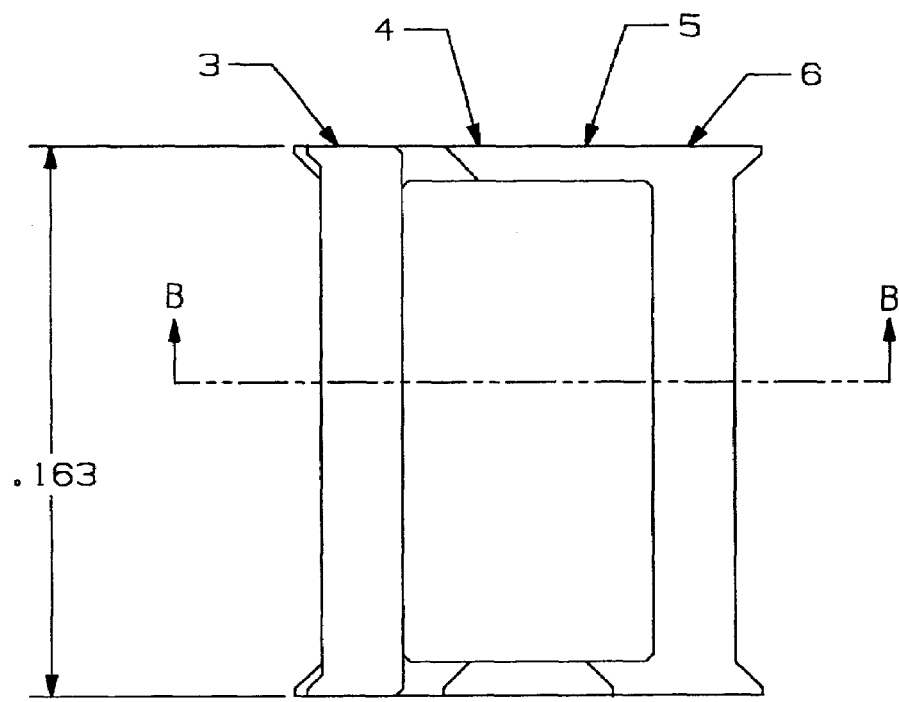
Figure 7G:
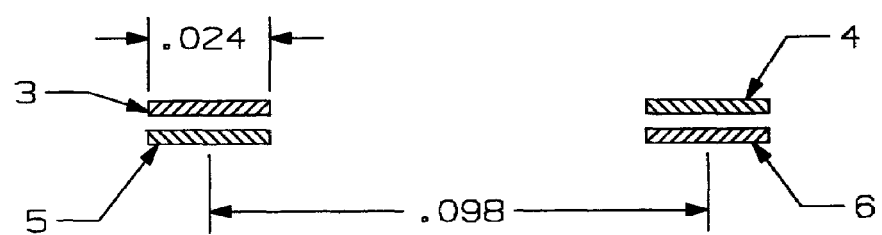
Figure 7H:
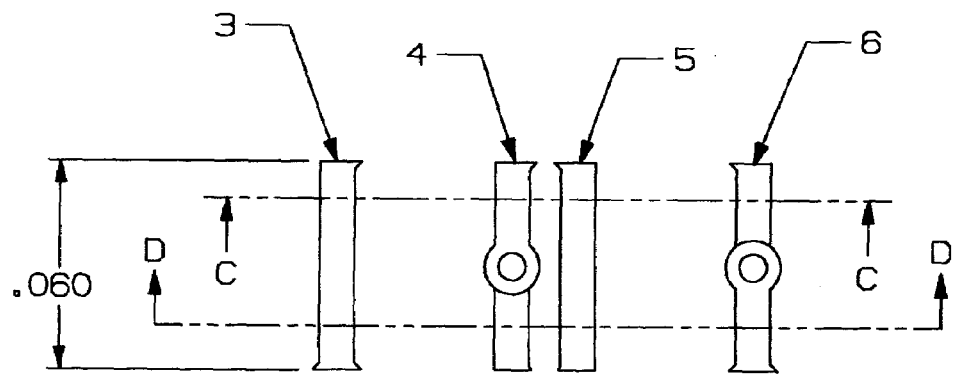
Figure 7H:
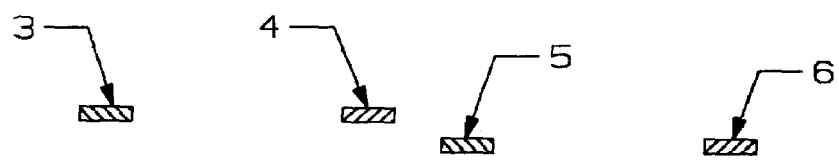
Figure 7H:
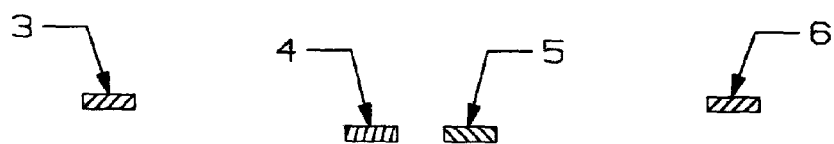
Figure 7I:
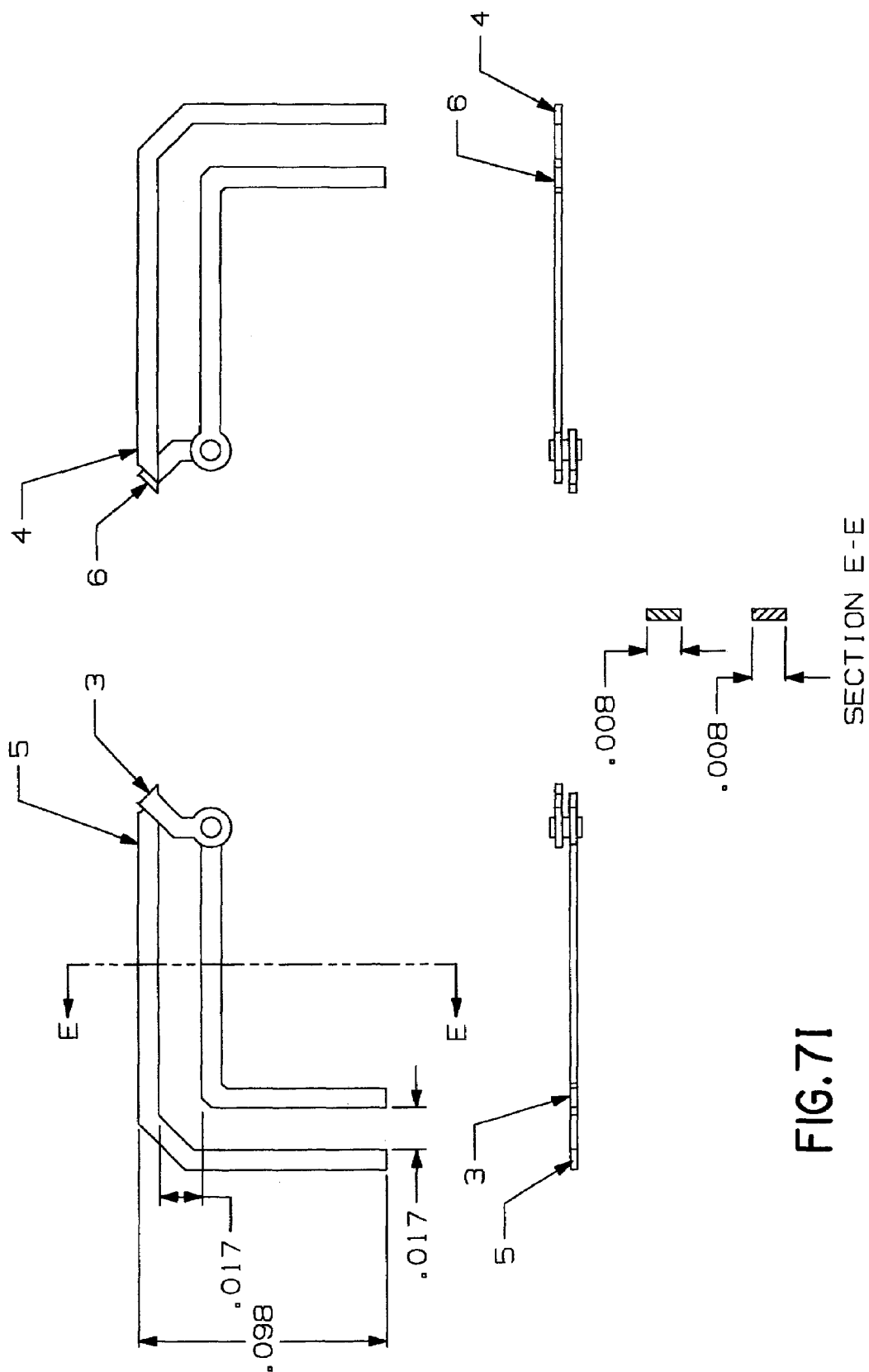
Figure 7J:
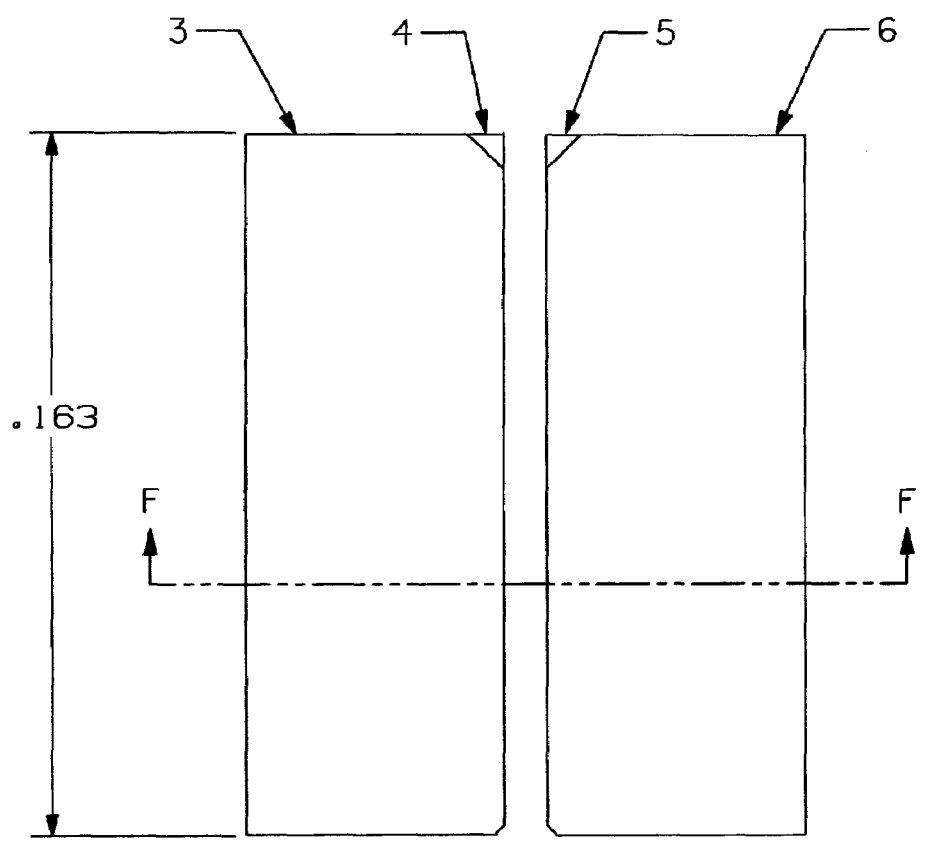
Figure 7J:
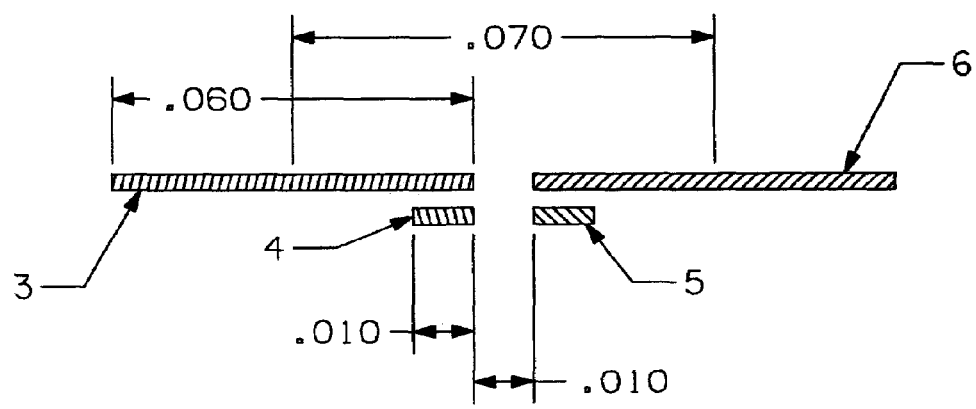
Figure 7K:
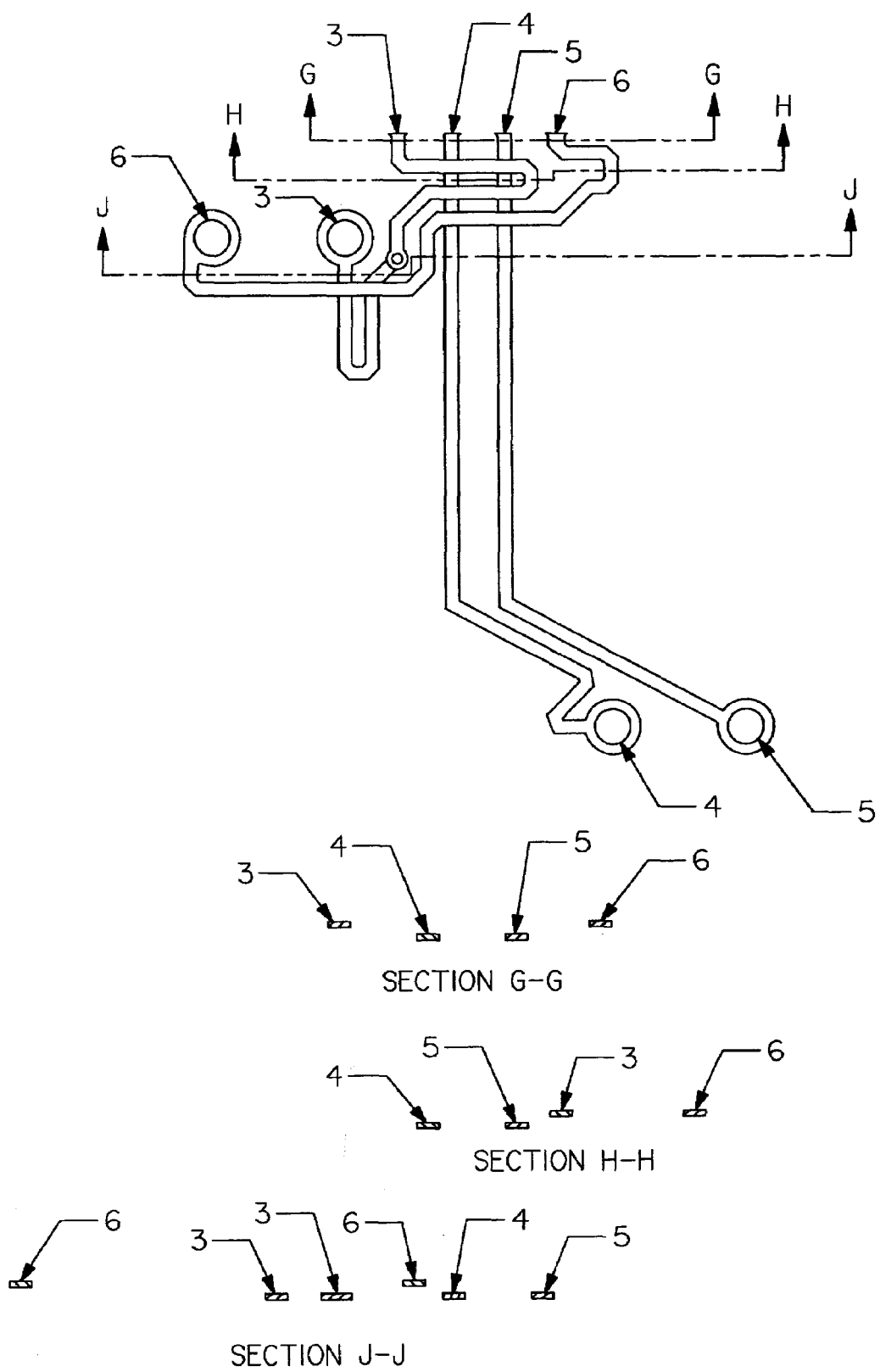

FIGS. 7F-7K illustrate cross-sections of the leads 3, 4, 5, and 6 at respective locations of the FPC 102 shown in FIG. 7A. Each of these figures includes an elevational view of a portion of the design shown in FIG. 7A, with a corresponding cross-sectional view taken across a sectional line. While the substrate of the FPC 102 itself is not shown in these views, the vertical displacement between trace cross-sections indicates on which side of the FPC 102 substrate the traces are located.

The configurations and specifications illustrated in FIGS. 7A-7K are directed to a preferred embodiment, and many other designs are possible and are intended to be within the scope of the present invention. Variations in design may be made to compensate for crosstalk and other effects. Similarly, jacks designed for communications cables having more or fewer than four pairs will obviously have different configurations and tolerances; however, the design concepts disclosed herein will apply similarly.

FIG. 8A-8I illustrate a design of an FPC 102 for leads 1-8 for a PCB in a communications jack. The FPC of this design has a similar footprint to that of FIG. 7A and some of the trace configurations are similar (see, e.g., Zone F); however, the design of FIGS. 8A-8I uses slightly different couplings and compensation techniques. Note that the designs shown in FIGS. 7A-7K and 8A-8I utilize an FPC 102 that has at least some compensation couplings that span a substantial portion of the entire length of the FPC 102. Zones A-E in the figures correspond to the FPC 102 and conductors 110 in FIGS. 1-5, while Zone F corresponds to the PCB 114, which is really just a rigid extension of the FPC 102 in this embodiment.

Figure 9A:
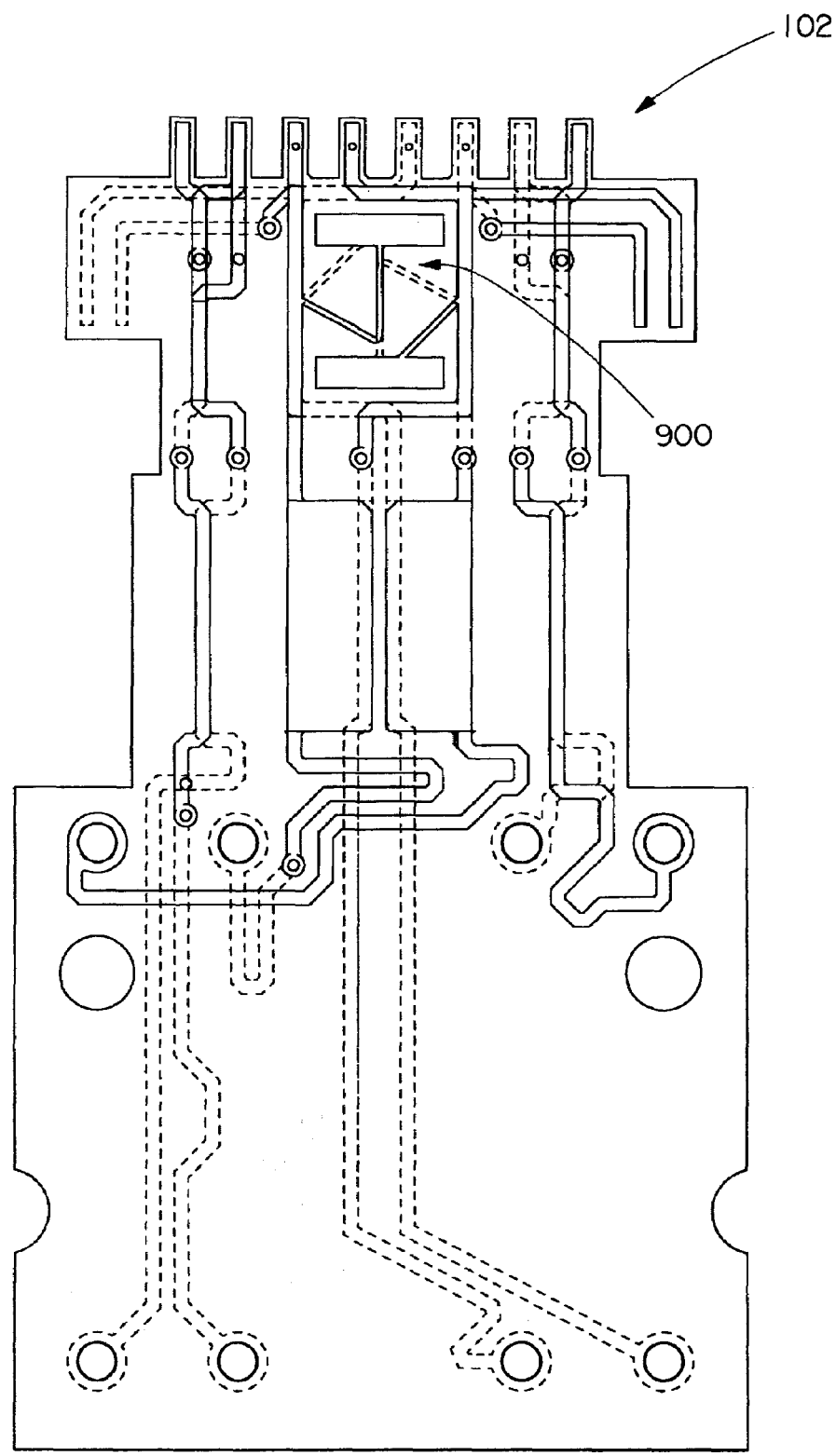
FIG. 9A illustrates an alternative design of a Flexible Printed Circuit for leads 1-8 for a Printed Circuit Board in a communications jack.
Figure 9B:
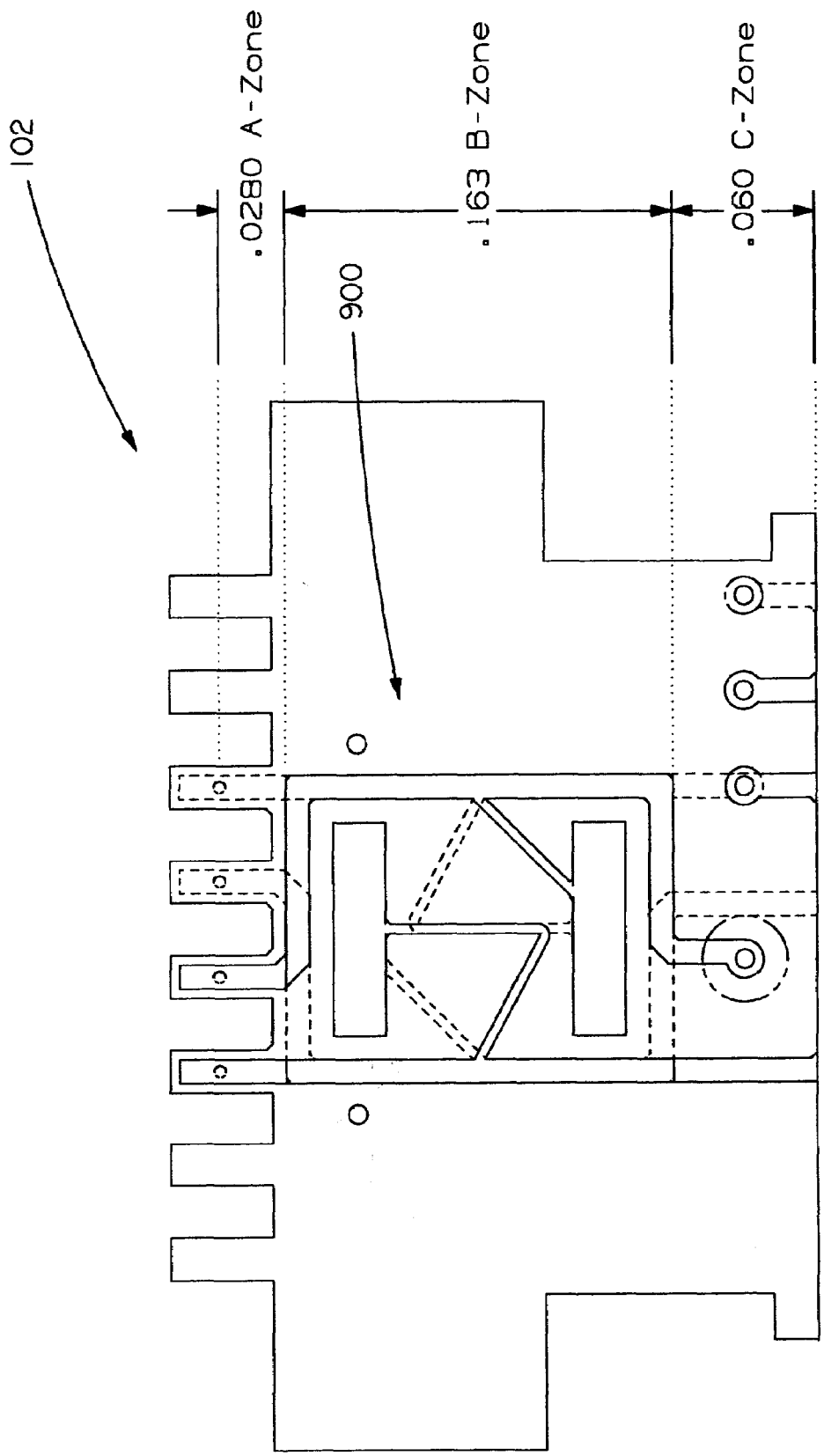
FIG. 9B illustrates a design of a capacitive coupling portion of a Flexible Printed Circuit for leads 3, 4, 5, and 6 for a Printed Circuit Board in a communications jack.
Figure 9C:
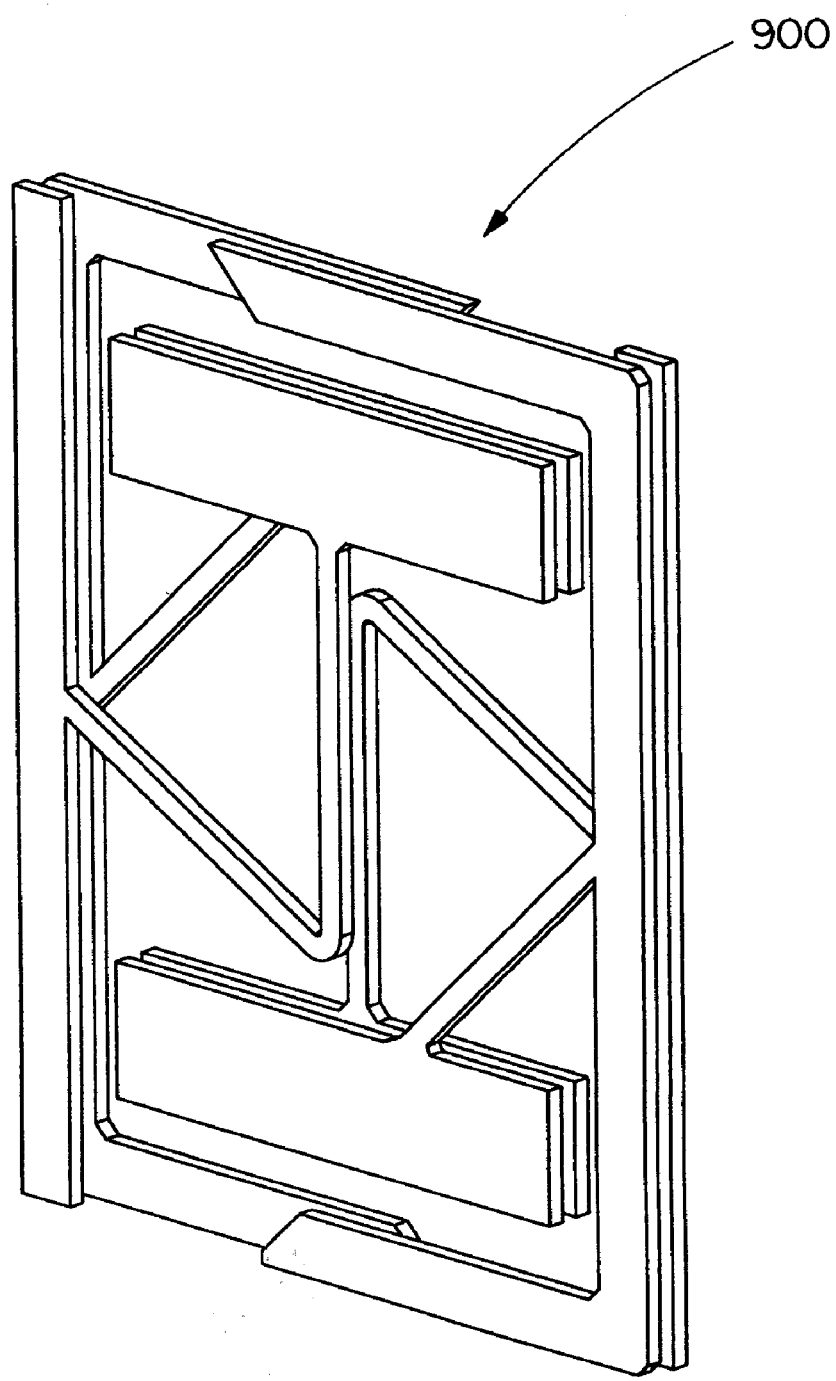
FIG. 9C is an upper perspective view of a portion of the design for traces 3, 4, 5, and 6 for the Flexible Printed Circuit of FIGS. 9A and 9B.

FIGS. 9A-9C illustrate an alternative design of an FPC 102 for leads 1-8 in a communications jack 100, in which the FPC incorporates a capacitive coupling 900 in the compensation zone (Zone B in FIG. 9B). This design utilizes the teachings of U.S. patent application Ser. No. 11/099,110, which claims priority to U.S. Provisional Patent Application Ser. No. 60/559,846, filed Apr. 6, 2004, which utilizes an inductive coupling which effectively decreases a capacitive coupling as frequency increases. This application is incorporated herein by reference in its entirety. In addition, U.S. patent application Ser. No. 11/055,344, filed Feb. 20, 2005 and U.S. patent application Ser. No. 11/078,816, filed Mar. 11, 2005 are incorporated herein by reference in their entireties.

FIG. 9B shows the capacitive coupling portion of the FPC for leads 3, 4, 5, and 6. FIG. 9C is an upper perspective view of this portion showing the capacitive plates, with the substrate removed for ease of illustration. In general, the distributed capacitive coupling of the compensation zone would be reduced by the magnitude, at low frequency, of the remote capacitive coupling that was added.

As was described above, the FPC 102 as installed in the jack 100 may be oriented vertically or horizontally. In FIGS. 1-9C, a vertical orientation was described. FIGS. 10-14C illustrate an embodiment incorporating an FPC designed for horizontal orientation.

Figure 10:
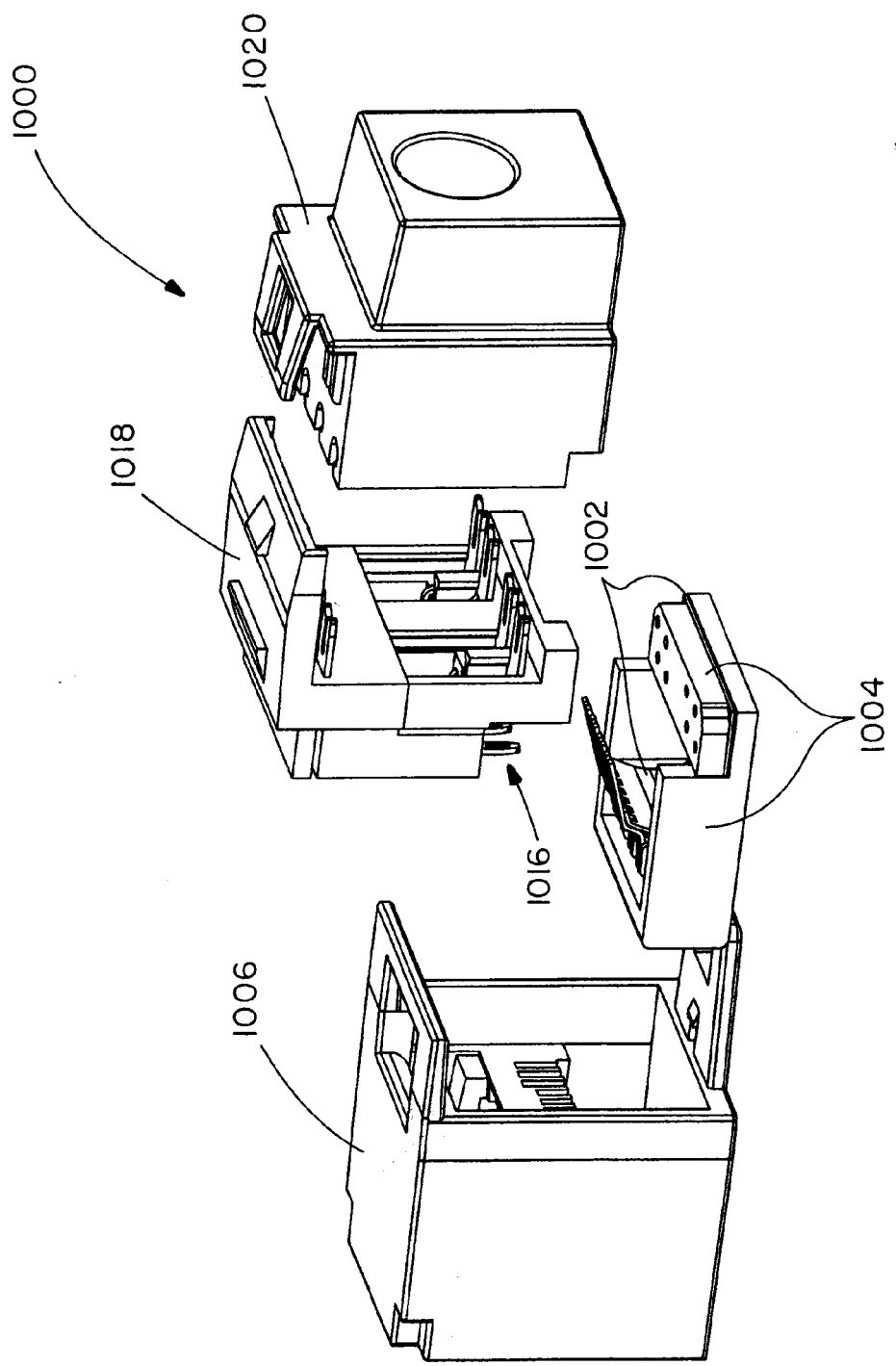
FIG. 10 is a rear exploded perspective view of an alternative communications jack.
Figure 11:
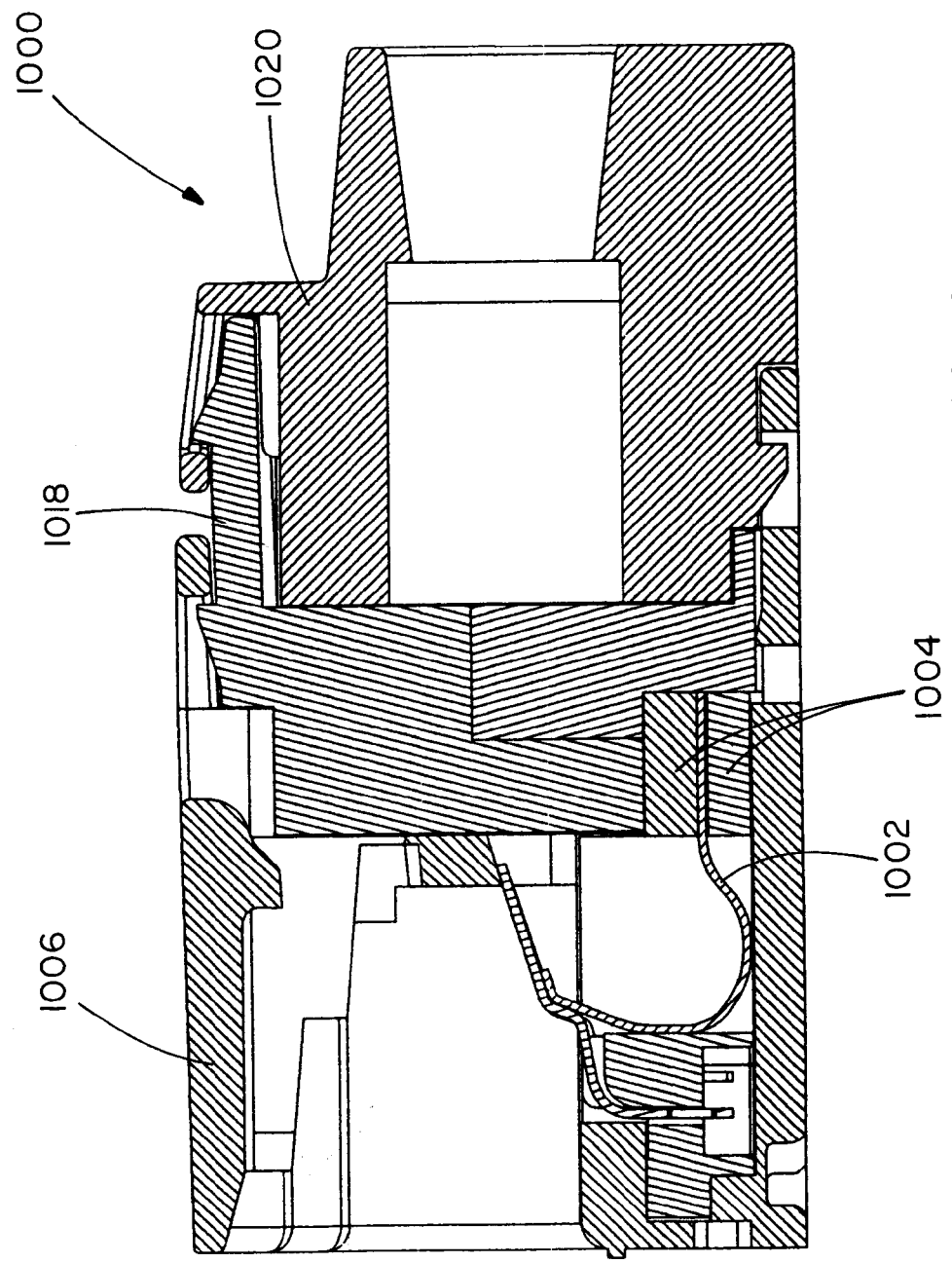
FIG. 11 is a side cross-sectional view of the communications jack of FIG. 10.

FIG. 10 is a rear exploded perspective view of a communications jack 1000 having a horizontally oriented FPC 1002. This design includes a sled mechanism 1004 configured to place the FPC 1002 in a horizontal position to receive the eight IDCs 1016 protruding downward from an intermediate IDC carrier 1018 that interfaces with the front and rear housings, 1006 and 1020, respectively. FIG. 11 is a side cross-sectional view of the communications jack 1000 of FIG. 10, in assembled form.

Figure 12:
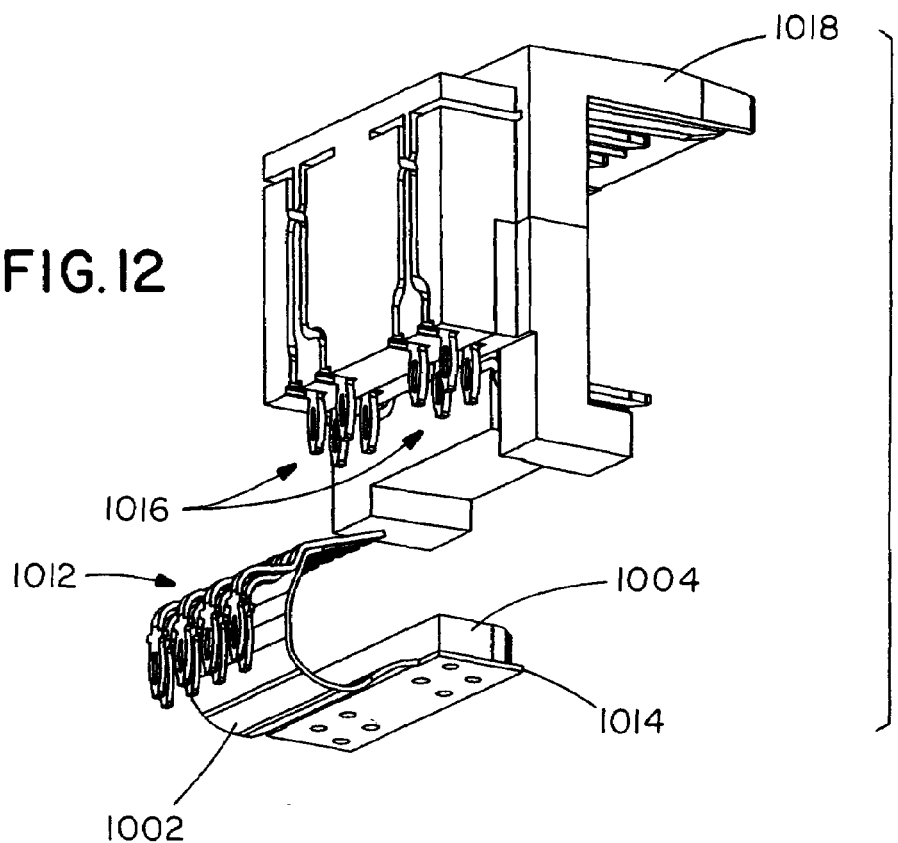
FIGS. 12 and 13 are perspective views of an internal portion of the communications jack of FIG. 10.
Figure 13:
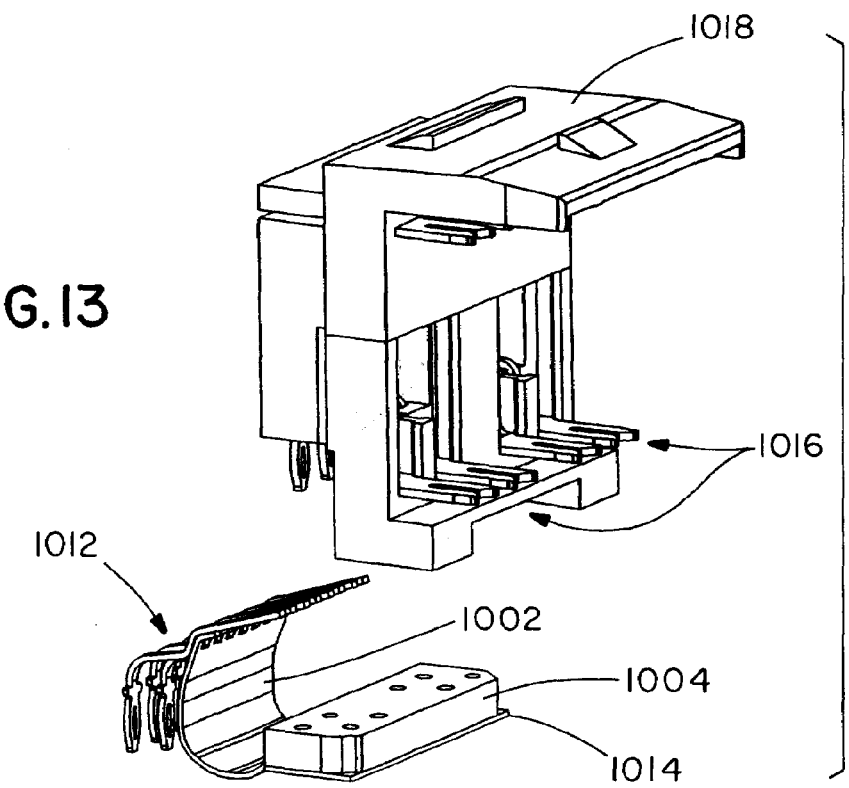

FIGS. 12 and 13 are partially exploded perspective views showing plug interface contacts 1012, the FPC 1002, an FPC rigid support 1014, the IDC carrier 1018, and the IDCs 1016 that are included within the communications jack 1000 of FIG. 10.

Figure 14A:
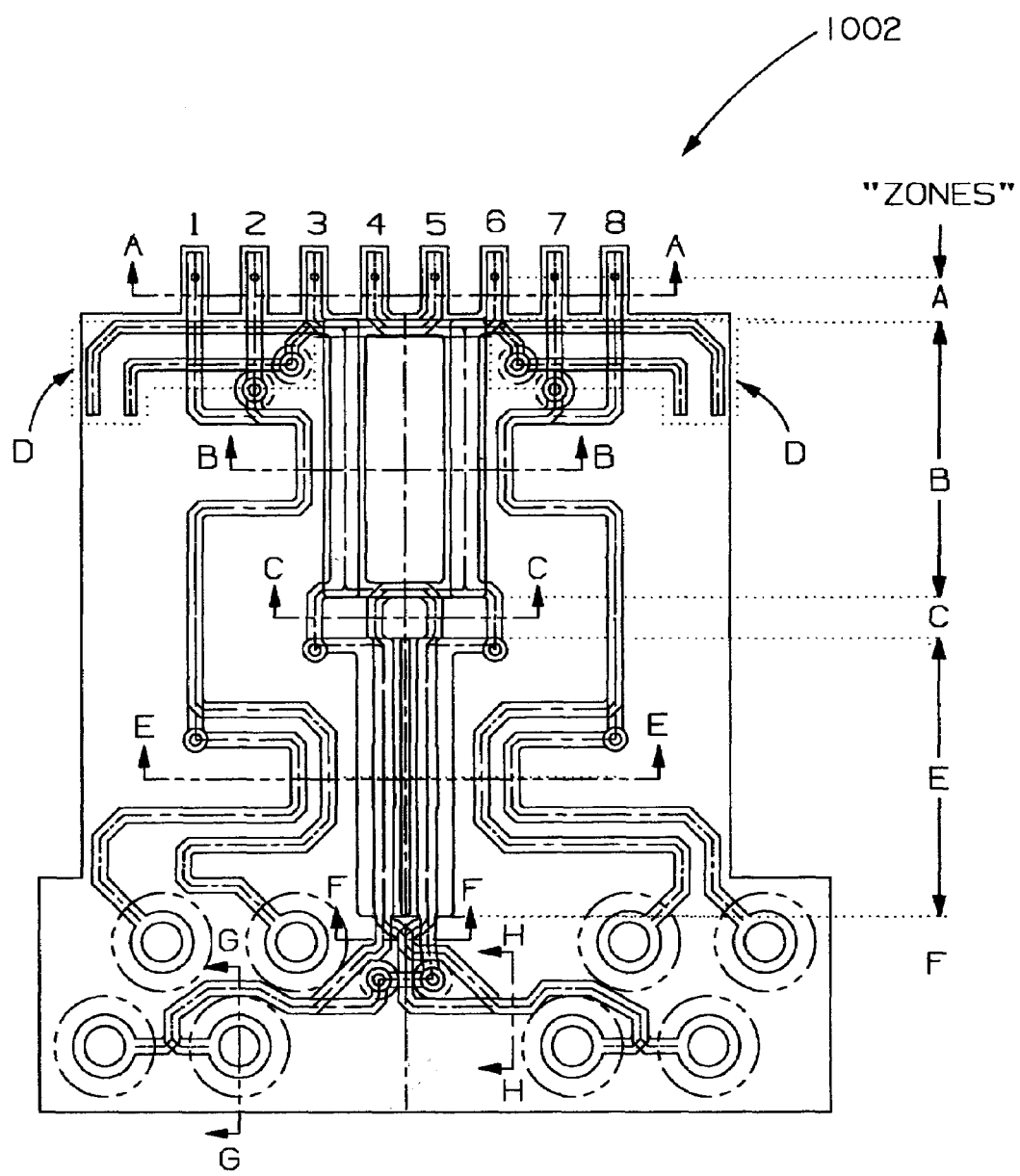
FIG. 14A illustrates a design of a Flexible Printed Circuit for leads 1-8 for a Printed Circuit Board in the communications jack of FIG. 10.
Figure 14B:
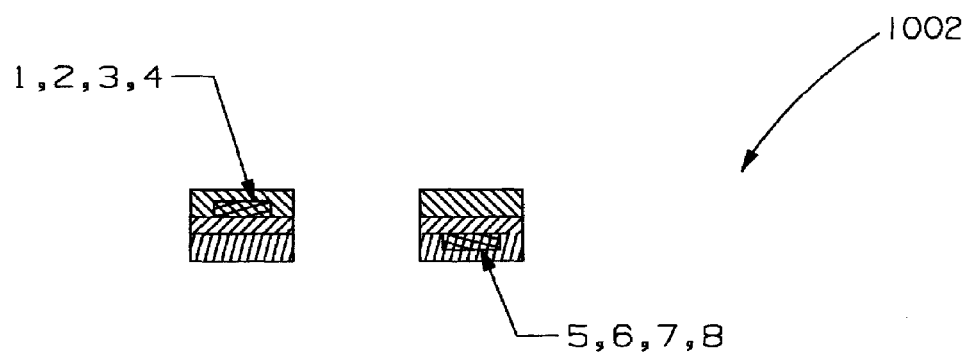
FIGS. 14B and 14C illustrate cross-sections of the leads 1-8 at various locations of the Flexible Printed Circuit shown in FIG. 14A.
Figure 14B:
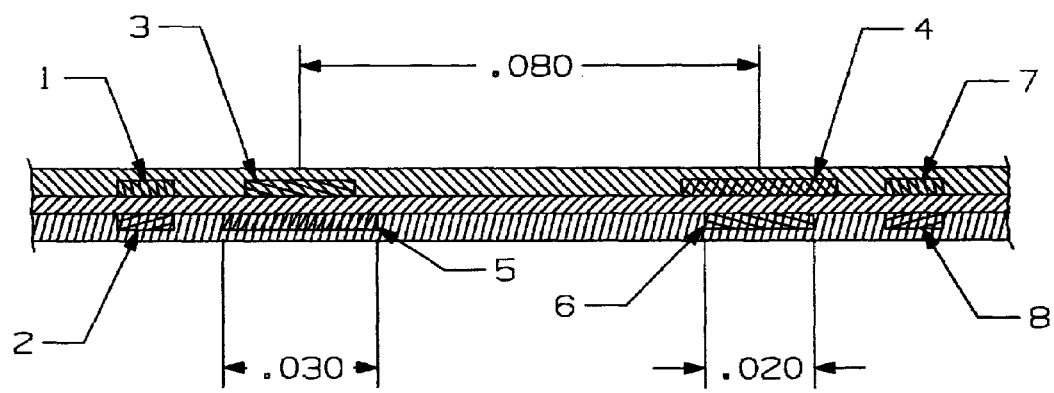
Figure 14B:
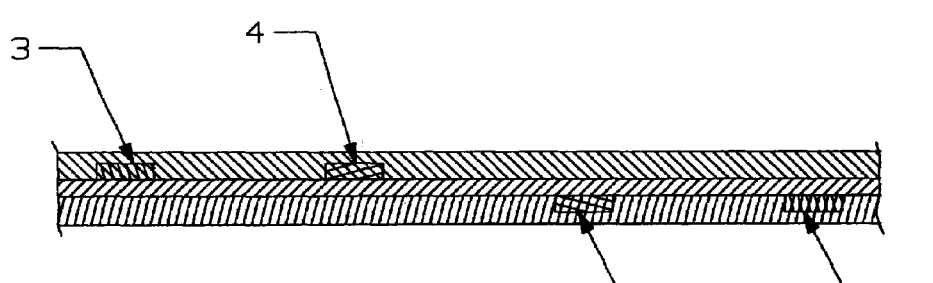
Figure 14C:
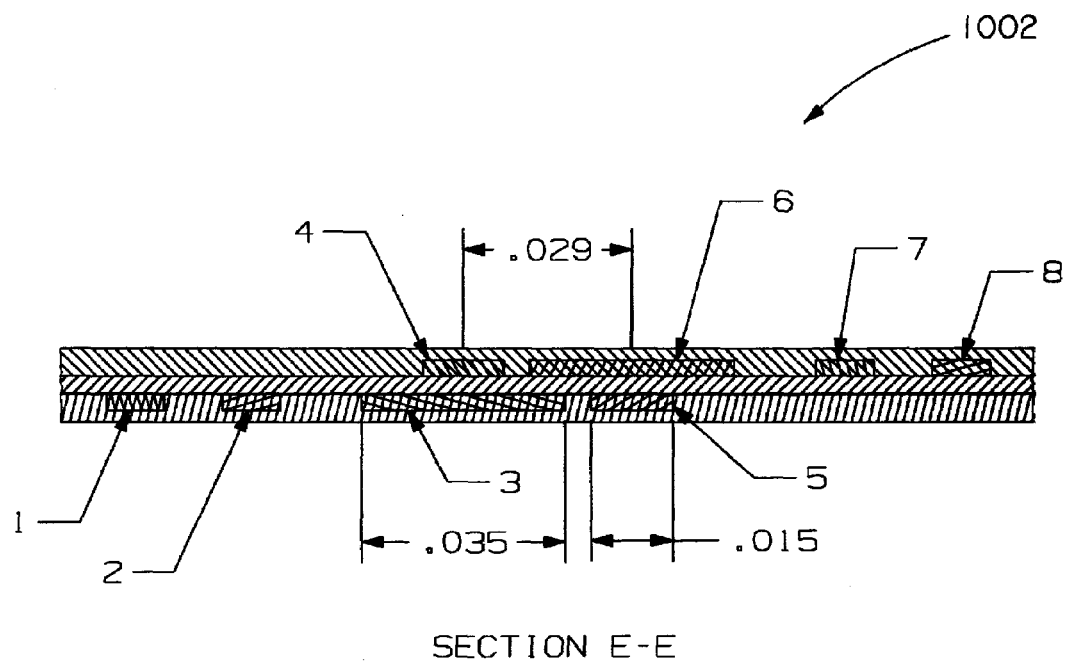
Figure 14C:
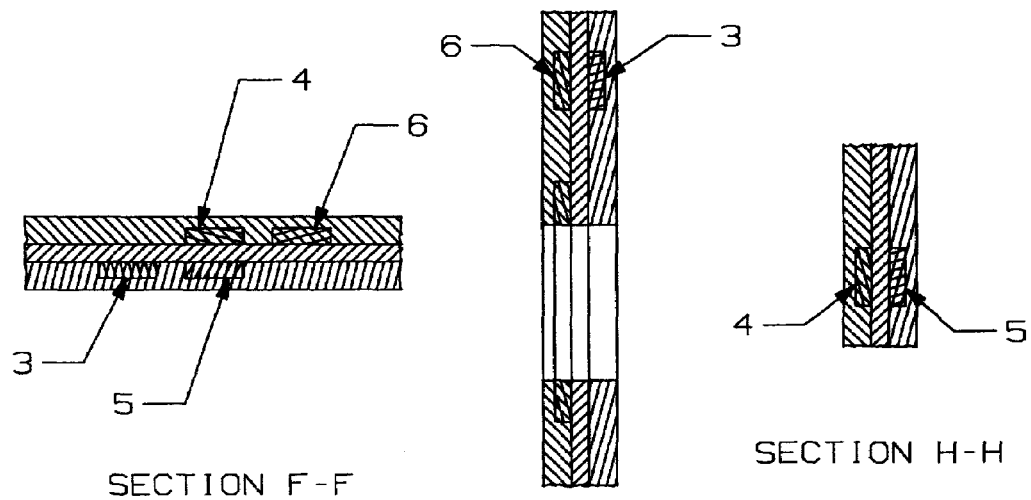

FIG. 14A illustrates a design of an FPC 1002 for leads 1-8 in the communications jack 1000 of FIG. 10. FIGS. 14B and 14C illustrate cross-sections of the leads 1-8 at various locations of the FPC 1002.

In the embodiments described herein, the FPC 102, 1002 is mechanically and electrically connected to the bottom of each plug interface contact directly under the plug/jack interface. The other end of the FPC 102, 1002 electrically connects each plug interface contact to an IDC and provides compensation for the crosstalk couplings of a specification plug. The plastic guides between the plug interface contacts have been minimized to minimize the dielectric and the capacitive couplings between plug interface contacts.

Figure 8A:
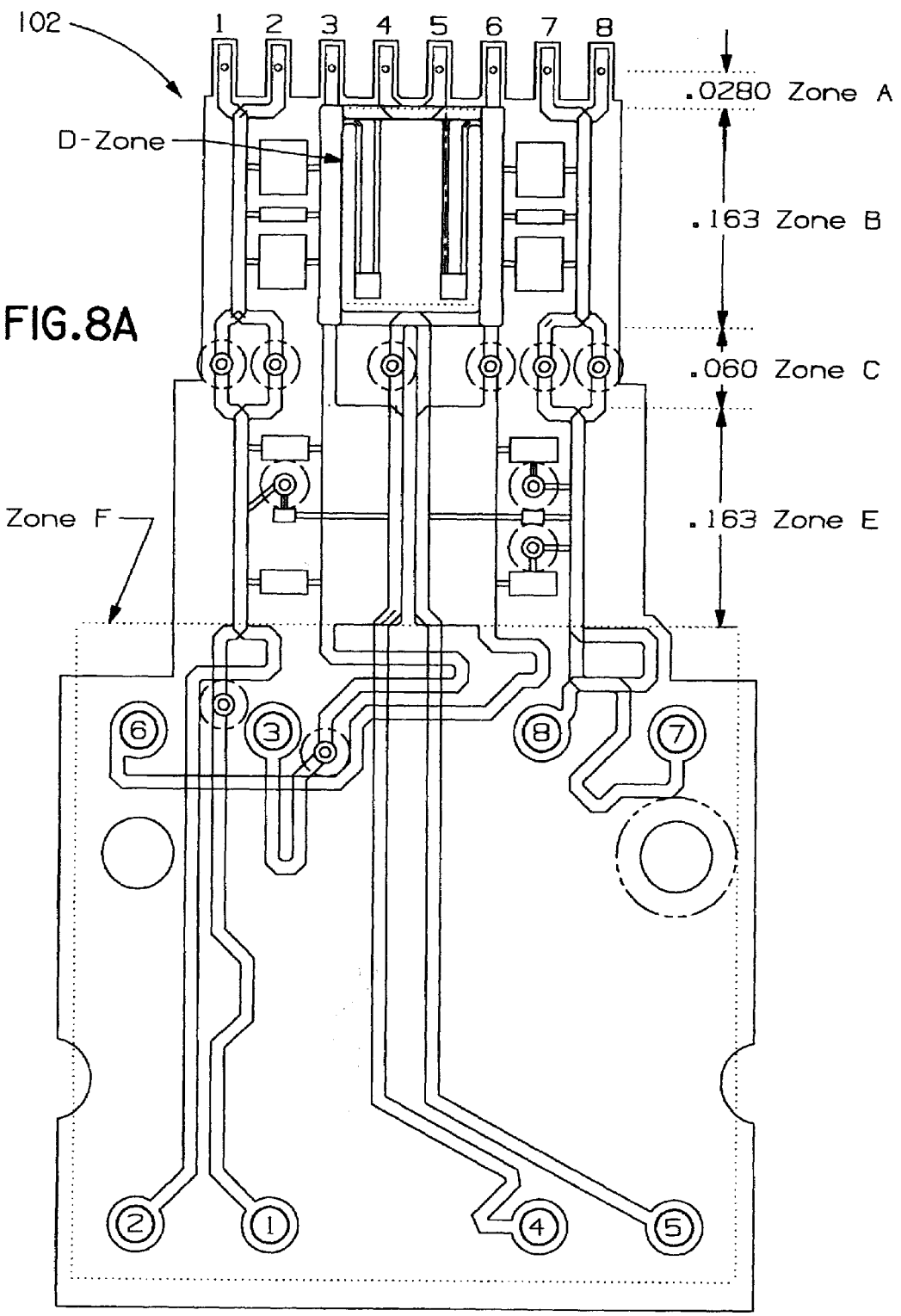
FIG. 8A illustrates a design of a Flexible Printed Circuit for leads 1-8 for a Printed Circuit Board in a communications jack.
Figure 8B:
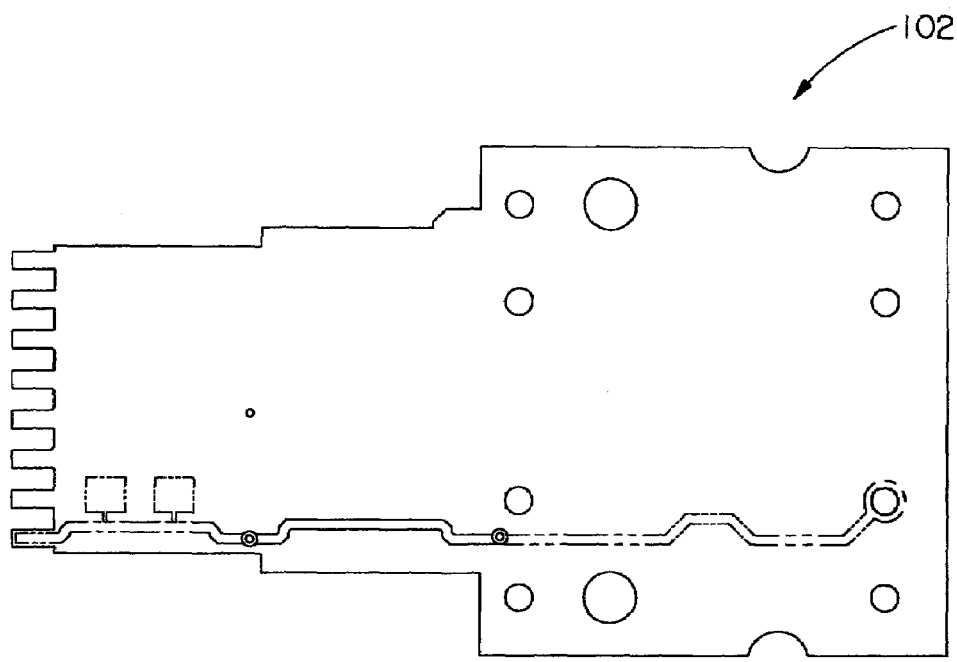
FIG. 8B illustrates a design of a Flexible Printed Circuit for lead 1 for a Printed Circuit Board in a communications jack.
Figure 8C:
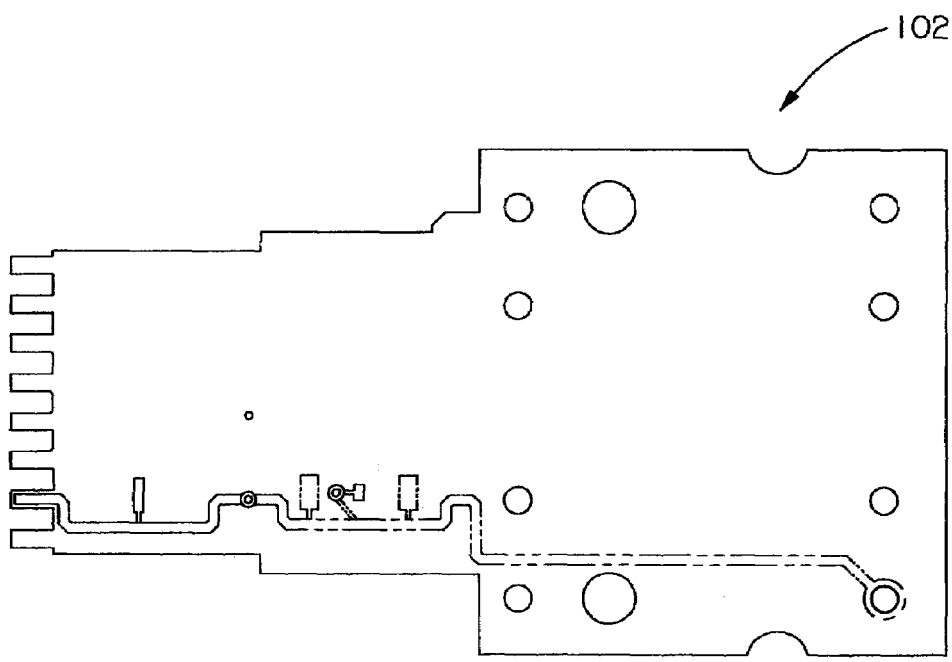
FIG. 8C illustrates a design of a Flexible Printed Circuit for lead 2 for a Printed Circuit Board in a communications jack.
Figure 8D:
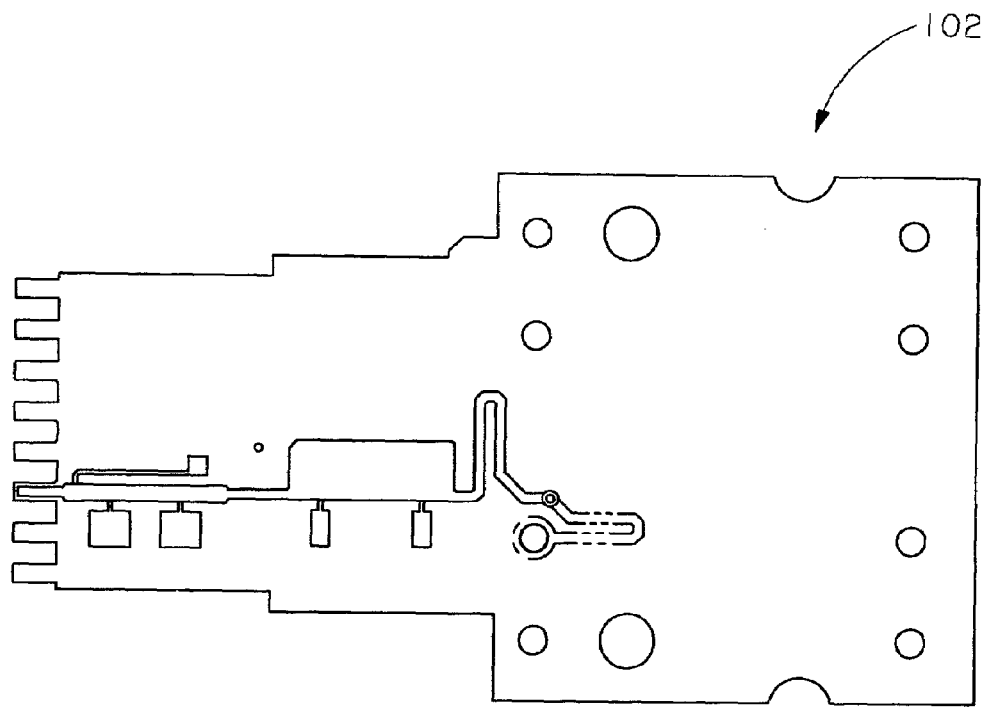
FIG. 8D illustrates a design of a Flexible Printed Circuit for lead 3 for a Printed Circuit Board in a communications jack.
Figure 8E:
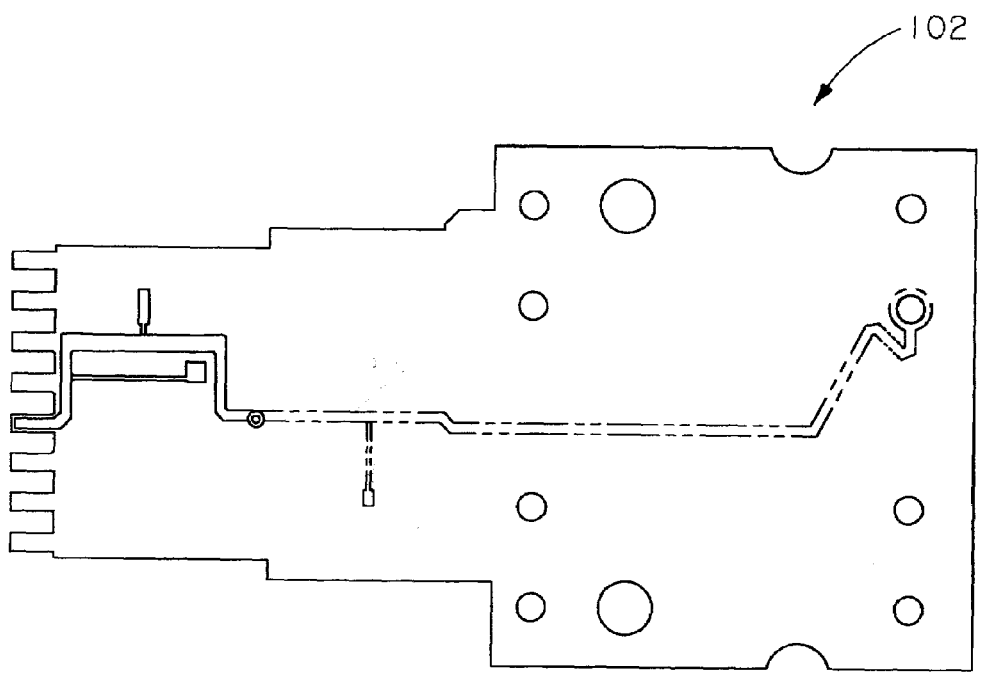
FIG. 8E illustrates a design of a Flexible Printed Circuit for lead 4 for a Printed Circuit Board in a communications jack.
Figure 8F:
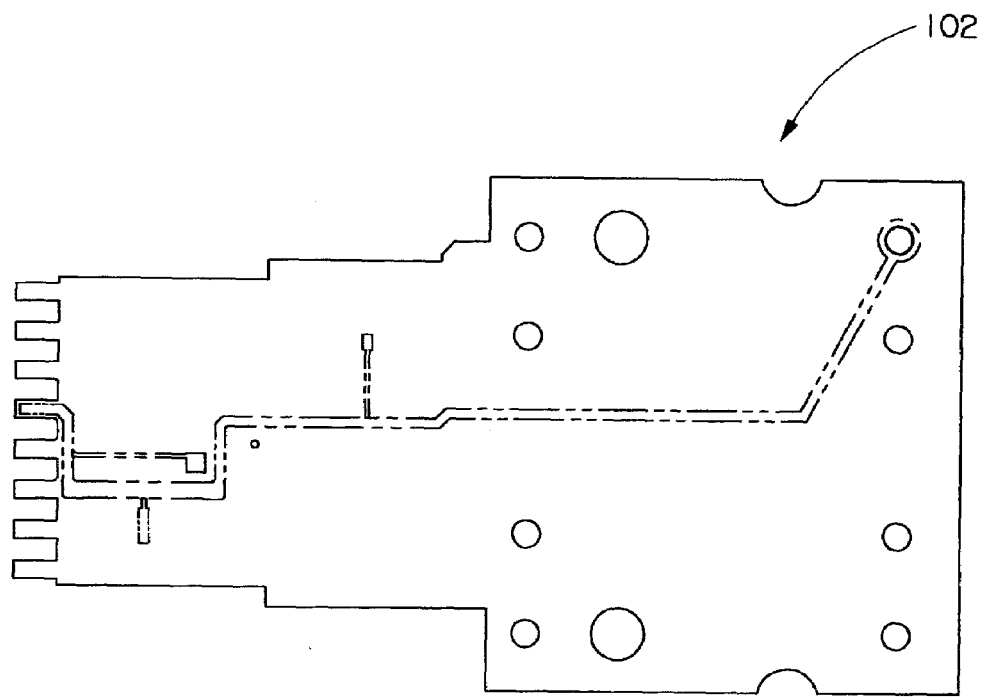
FIG. 8F illustrates a design of a Flexible Printed Circuit for lead 5 for a Printed Circuit Board in a communications jack.
Figure 8G:
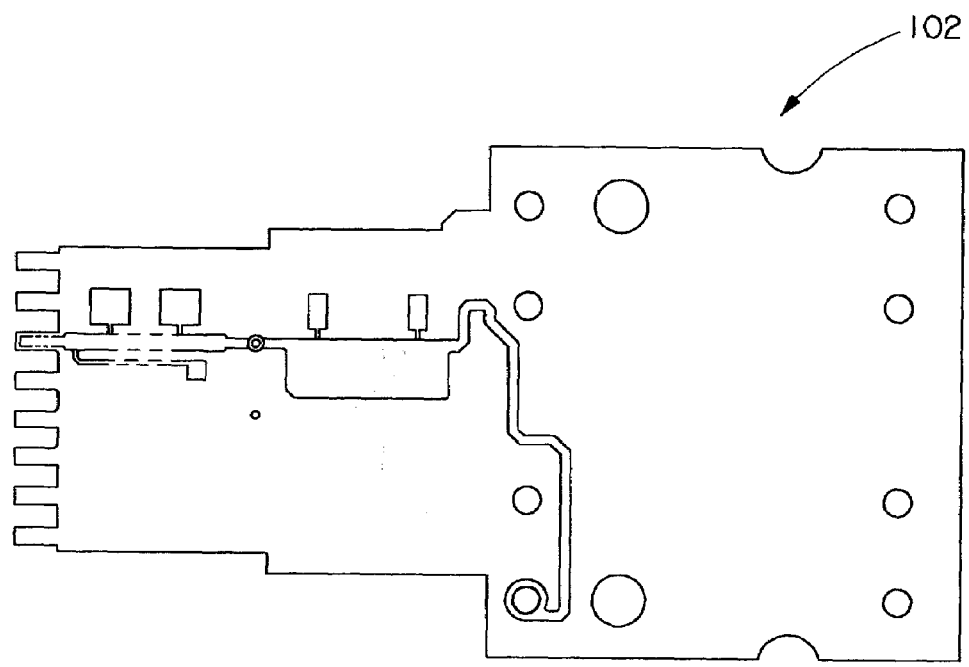
FIG. 8G illustrates a design of a Flexible Printed Circuit for lead 6 for a Printed Circuit Board in a communications jack.
Figure 8H:
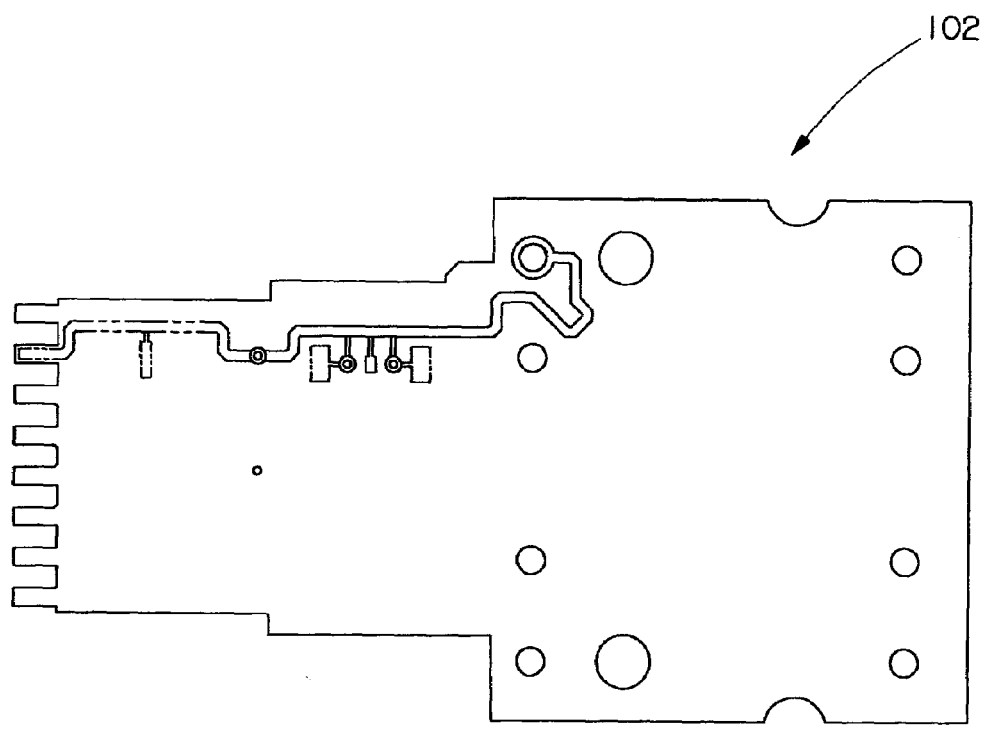
FIG. 8H illustrates a design of a Flexible Printed Circuit for lead 7 for a Printed Circuit Board in a communications jack.
Figure 8I:
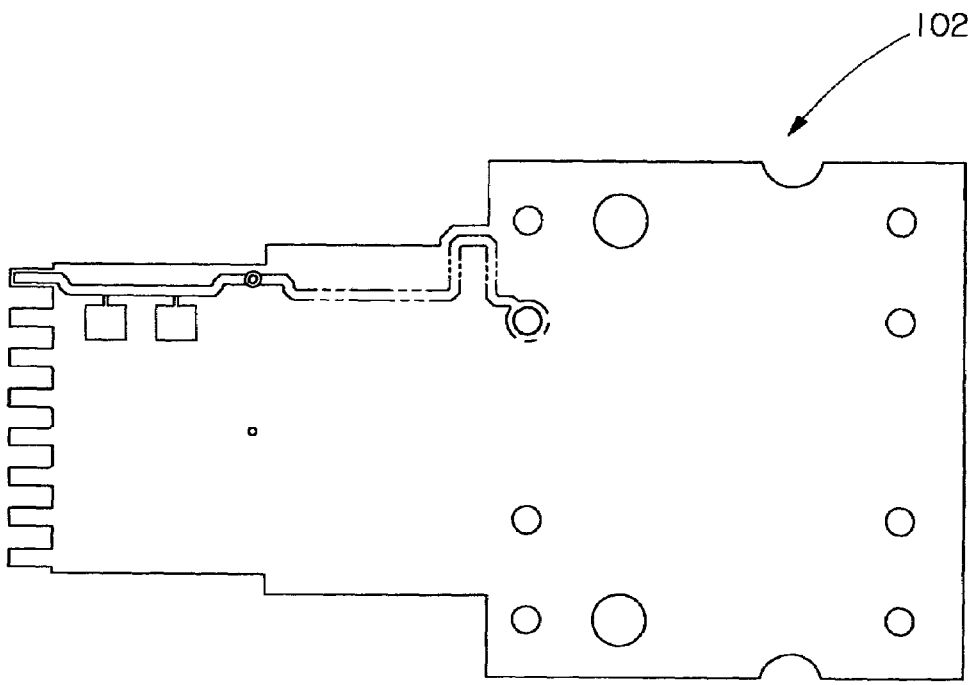
FIG. 8I illustrates a design of a Flexible Printed Circuit for lead 8 for a Printed Circuit Board in a communications jack.

In FIGS. 7A, 8A, and 14A, Zones A-F are shown. These zones generally act as follows: Zone A is a transition zone from the connection to the plug interface contacts to the NEXT (Near-End CrossTalk) compensation zone; Zone B is the NEXT compensation zone; Zone C is a transition zone from the NEXT compensation zone to the NEXT crosstalk zone; Zone D is a compensation zone to compensate for the plug interface contacts; Zone E is the NEXT crosstalk zone; and Zone F is a neutral zone that connects the NEXT crosstalk zone to sockets for the IDCs.

The design objectives of Zone C are to make its inductive and capacitive couplings and the length of the circuit paths equal to those of Zone A. The magnitude of the total crosstalk coupling of the NEXT crosstalk zone is approximately equal to that of a specification plug. The magnitude of the total compensation coupling of the NEXT compensation zone is slightly less than twice the crosstalk coupling of a specification plug plus twice the total coupling of Zone A.

In a preferred embodiment shown in FIG. 7A, which includes only leads 3, 4, 5 and 6, all the zones except Zone D have distributed couplings and no remote couplings. The design of the FPC for leads 3, 4, 5 and 6 reduces the variation in coupling changes due to registration variation between the conductors on each of the two sides of the FPC 102 and reduces couplings due to trace width variations. Zone D provides remote capacitive coupling, and is connected close to the plug/jack interface. The phase angle change between the effective center of couplings of a specification plug and the center of the NEXT compensation zone is approximately equal to the phase angle change between the center of the NEXT crosstalk zone and the NEXT compensation zone. The combination of the jack and a specification plug is therefore symmetrical about the center of the NEXT compensation zone. As a result, Forward NEXT is equal to Reverse NEXT.

Since the NEXT compensation zone is connected to the plug/jack interface by short circuit paths in the FPC, the phase angle change between them is minimized, as is the change in compensation versus frequency.

The total inductive coupling of the NEXT compensation zone is approximately equal to the total inductive couplings of the balance of the circuit path of the jack and a specification plug. This results in a very low FEXT.

The flexibility of the FPC 102, 1002 allows it to be connected to all the plug interface contacts, which do not move exactly in unison when a plug is installed. It also facilitates connection to various orientations of IDCs or to a PCB. The relatively thin dielectric layer of the FPC 102, 1002 as compared to that of a PCB facilitates a relatively short NEXT compensation zone. As shown in the various figures herein, the FPC 102, 1002 may include a plurality of fingers for attachment to the plug interface contacts.

The length of the NEXT compensation zone is approximately equal to the length of the NEXT crosstalk zone. The result is that variations in FPC trace width, which tend to be consistent on an individual FPC 102, 1002, change the capacitive coupling of the NEXT compensation zone and the NEXT crosstalk zone by approximately the same magnitude. This minimizes the compensation variation due to trace width variation.

The circuit paths for pairs 1,2 and 7,8 in the embodiments described herein illustrate how compensation between other pair combinations can be attained. The required compensation for other pair combinations is typically much more easily attained than for pairs 3,6 and 4,5, due to the orientation of these pairs in a specification plug.

FIGS. 15A-15G illustrate an alternative embodiment of a flexible PCB for a front assembly in a communications jack 1500. Disposed in a housing 1502 of the communications jack 1500 is a front sled assembly comprising a top front sled 1510, a bottom front sled 1512, plug interface contacts 1504, an FPC 1508, staking posts 1514, and a front sled mandrel 1506.

Figure 15A:
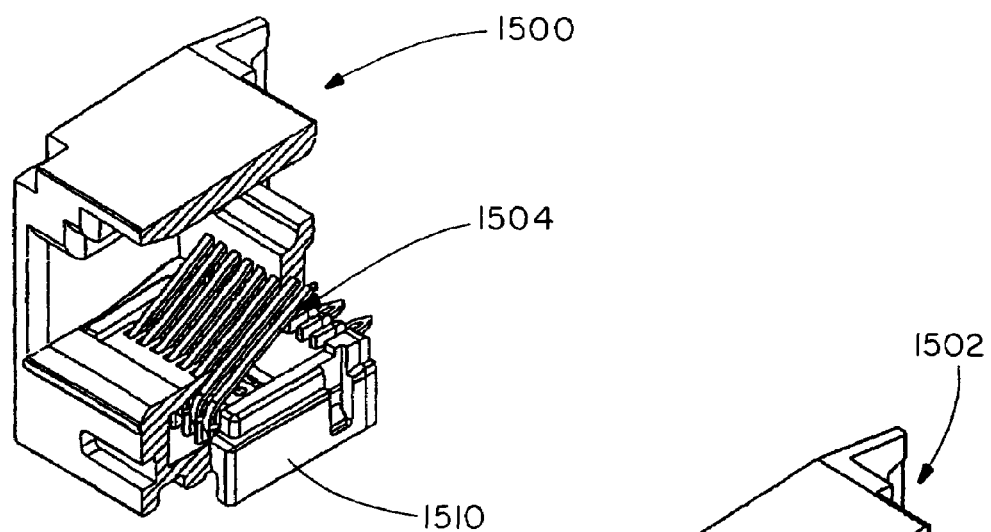
FIG. 15A is a perspective view of a portion of a communications jack.
Figure 15B:
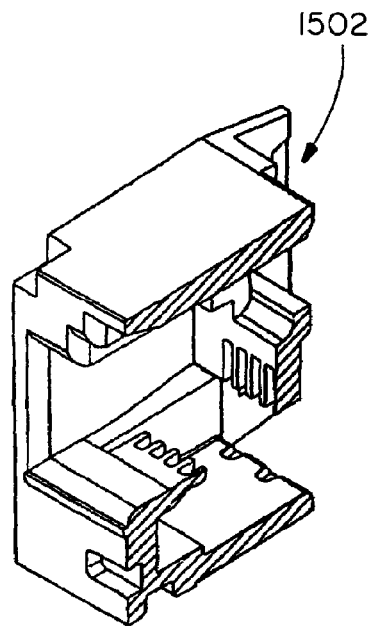
FIG. 15B is a perspective view of a portion of a housing of a communications jack.
Figure 15C:
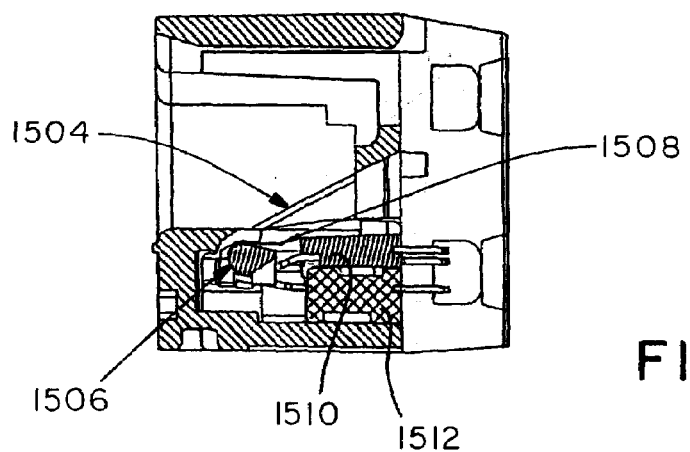
FIG. 15C is a side cross-sectional view of a communications jack.
Figure 15D:
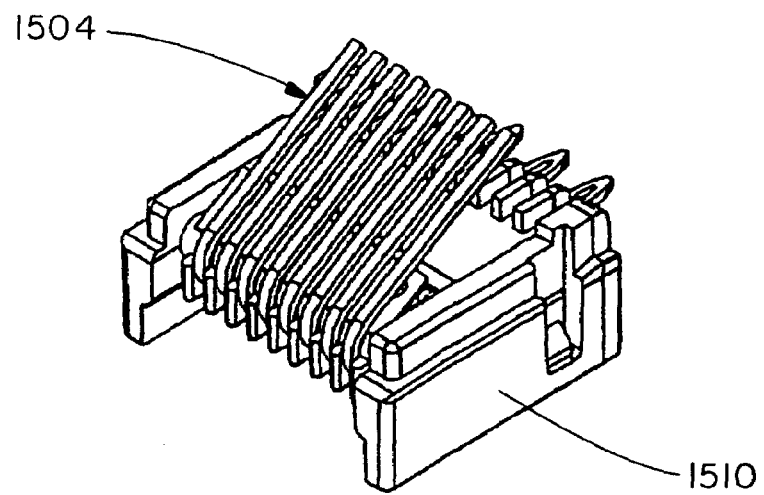
FIG. 15D is a perspective view of a front sled assembly.
Figure 15E:
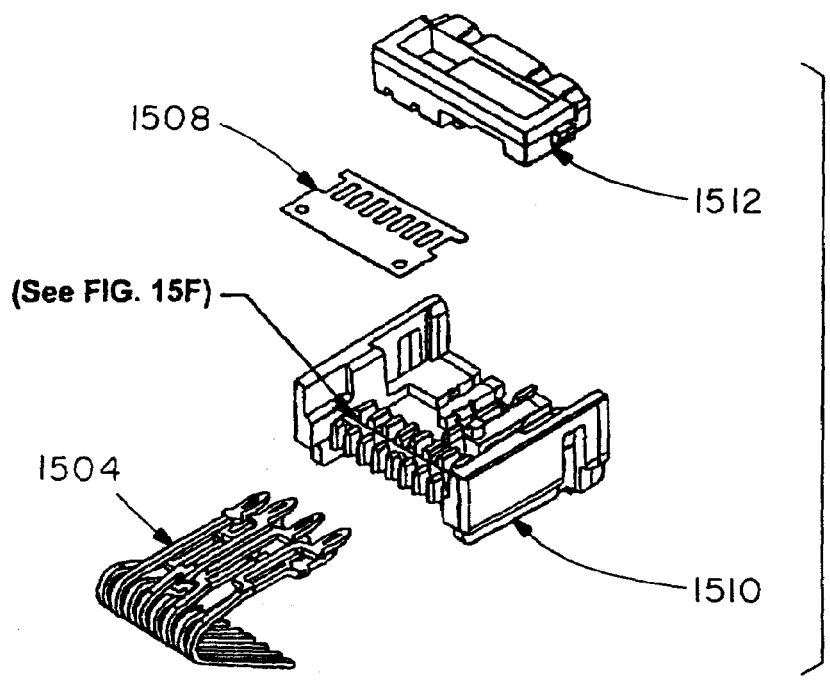
FIG. 15E is an exploded perspective view of a front sled assembly, viewed from below.
Figure 15F:
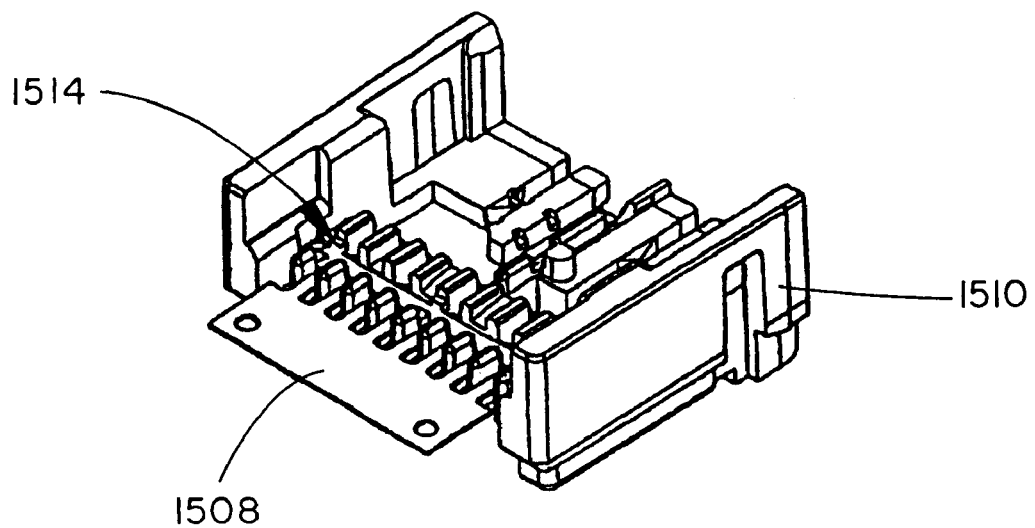
FIG. 15F is perspective view of a top front sled and flexible printed circuit board as it might appear during assembly, viewed from below.
Figure 15G:
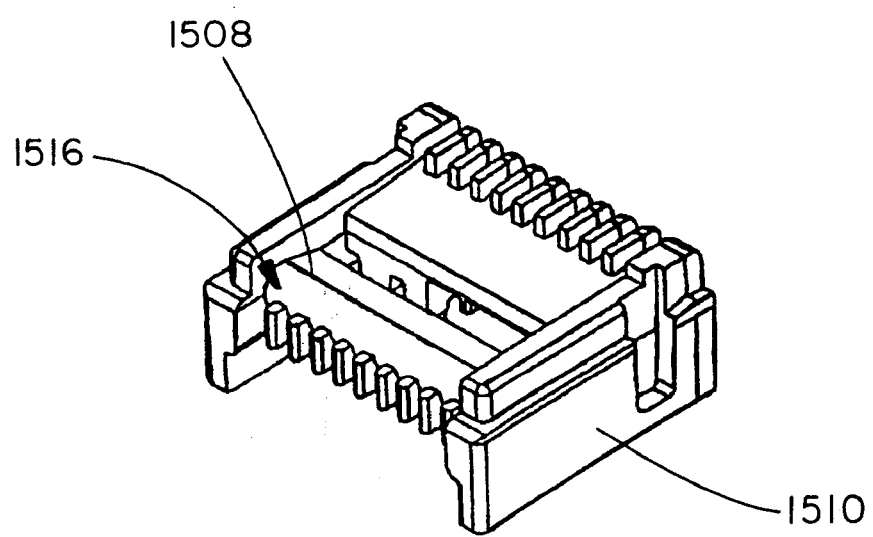
FIG. 15G is a perspective view of a top front sled and flexible printed circuit board as it might appear during a later stage of assembly, viewed from above.

The FPC 1508 is placed in the comb slot on the underside of the top front sled 1510 (see FIGS. 15E and 15F). While being held in place, the FPC 1508 is attached with multiple staking posts 1514. The plug interface contacts 1504 are placed, staked, and bent around the front sled mandrel 1506 of the top front sled 1510, along with the FPC 1508. To allow for the presence of the FPC 1508 without changing the profile of the plug interface contacts 1504, the diameter of the front sled mandrel 1506 has a smaller diameter than that of some previous communication jack designs.

Unlike some top front sleds in previous communication jack designs, the upper half of the combs have been moved from the top front sled and are instead located on the housing 1502 (see FIG. 15B). The housing 1502 has fingers that slide over the FPC 1508 and move the FPC 1508 away from the back of the contacts (see FIG. 15A). Separation of the FPC 1508 from the plug interface contacts 1504 helps to prevent crosstalk between the FPC 1508 and the plug interface contacts 1504.

Because the FPC 1508 is attached directly to the plug interface contacts 1504, crosstalk compensation circuitry (located on the FPC 1508) is provided at the closest point to the plug/jack interface. As a result, performance is significantly improved, and transmission rates at 10 Gigabits/sec. or more are attainable in some embodiments.

What is claimed:

1. A communications jack configured to accept a communication plug to create a communications connector, the jack comprising:
    a cavity configured to accept a plug;
    a plurality of plug interface contacts that extend into the cavity such that the plug in the cavity makes electrical contact with the plug interface contacts at a plug/jack interface of each plug interface contact; and
    a flexible printed circuit board (FPC) that extends into the cavity such that the FPC is electrically and mechanically connected in the cavity to the plug interface contacts in the proximity of the plug/jack interfaces.

2. The communications jack of claim 1, further comprising a plurality of insulation displacement contacts that is configured to make electrical contact with a communications cable, the FPC electrically and mechanically connected to the insulation displacement contacts.

3. The communications jack of claim 1, wherein the FPC extends from an end of the FPC in contact with the plug interface contacts in a direction of removal of the plug from the jack.

4. The communications jack of claim 1, wherein the FPC extends from an end of the FPC in contact with the plug interface contacts in a direction of insertion of the plug into the jack.

5. The communications jack of claim 1, further comprising a rigid support facilitating communication between the FPC and a communication cable, the rigid support supporting a portion of the FPC that does not contact the plug interface contacts.

6. The communications jack of claim 5, further comprising conductors that electrically connect the rigid support and the FPC, the rigid support comprising a printed circuit board connected to the FPC through the conductors.

7. The communications jack of claim 5, wherein the rigid support is substantially parallel to a direction of insertion of the plug into the jack.

8. The communications jack of claim 5, wherein the rigid support is substantially perpendicular to a direction of insertion of the plug into the jack.

9. A communications jack configured to accept a communication plug to create a communications connector, the jack comprising:
    a plurality of plug interface contacts for making electrical contact with a plug at a plug/jack interface of each plug interface contact;
    a plurality of insulation displacement contacts for making electrical contact with a communications cable; and
    a flexible printed circuit board (FPC) electrically and mechanically connected at a first end to the plug interface contacts and at a second end to the insulation displacement contacts, thereby electrically connecting the plug with the communications cable,
    wherein the FPC is connected to the plug interface contacts at the plug/jack interface of each plug interface contact.

10. The communications jack of claim 9, wherein the FPC is connected to the plurality of plug interface contacts by fingers that allow the FPC to flex as individual plug interface contacts are depressed when the plug is installed in the jack.

11. The communications jack of claim 9, wherein the FPC is supported in part by a sled and in part by a printed circuit board (PCB).

12. The communications jack of claim 9, wherein the FPC has a rigid extension containing through holes configured to accept the plurality of insulation displacement contacts.

13. The communications jack of claim 12, wherein the FPC is vertically oriented with respect to a horizontal insertion of the plug into the jack.

14. The communications jack of claim 13, wherein the insulation displacement contacts are horizontally oriented with respect to the horizontal insertion direction of the plug into the jack.

15. The communications jack of claim 12, wherein the FPC is horizontally oriented with respect to a horizontal insertion of the plug into the jack.

16. The communications jack of claim 15, wherein the insulation displacement contacts are vertically oriented with respect to the horizontal insertion of the plug into the jack.

17. A communications jack for accepting a communication plug to create a communications connector, comprising:
    a plurality of plug interface contacts each configured to make electrical contact with a plug at a first side of a plug/jack interface of the plug interface contact; and
    a flexible printed circuit board (FPC) electrically and mechanically connected at a first end to the plurality of plug interface contacts at a second side of the plug/jack interface of each plug interface contact.

18. The communications jack of claim 17, further comprising a plurality of insulation displacement contacts for making electrical contact with a communications cable, the FPC electrically and mechanically connected at a second end to the plurality of insulation displacement contacts, thereby electrically connecting the plug with the communications cable.

19. The communications jack of claim 17, wherein a portion of the FPC in contact with the plug interface contacts extends from the first end of the FPC substantially in a direction of removal of the plug from the jack.

20. The communications jack of claim 17, wherein a portion of the FPC in contact with the plug interface contacts extends from the first end of the FPC substantially in a direction of insertion of the plug into the jack.

21. The communications jack of claim 17, further comprising a rigid support facilitating communication between the FPC and a communication cable, the rigid support supporting a portion of the FPC that is not connected to the plurality of plug interface contacts.

22. The communications jack of claim 21, further comprising conductors that electrically connect the rigid support and the FPC, the rigid support comprising a printed circuit board connected to the FPC through the conductors.

23. The communications jack of claim 21, wherein the rigid support is substantially parallel to a direction of insertion of the plug into the jack.

24. The communications jack of claim 21, wherein the rigid support is substantially perpendicular to a direction of insertion of the plug into the jack.

* * * * *